(12) United States Patent
Oh et al.

(10) Patent No.: US 12,056,007 B2
(45) Date of Patent: Aug. 6, 2024

(54) STORAGE DEVICES AND METHODS OF OPERATING STORAGE DEVICES

(71) Applicant: SAMSUNG ELECTRONICS CO., LTD., Suwon-si (KR)

(72) Inventors: Eun Chu Oh, Hwaseong-si (KR); Junyeong Seok, Seoul (KR); Younggul Song, Hwaseong-si (KR); Byungchul Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/702,291

(22) Filed: Mar. 23, 2022

(65) Prior Publication Data
US 2023/0054754 A1    Feb. 23, 2023

(30) Foreign Application Priority Data
Aug. 17, 2021    (KR) .................... 10-2021-0107892

(51) Int. Cl.
*G06F 11/10*    (2006.01)
*G06F 11/07*    (2006.01)
(Continued)

(52) U.S. Cl.
CPC ........ *G06F 11/1068* (2013.01); *G06F 11/076* (2013.01); *G11C 11/4074* (2013.01);
(Continued)

(58) Field of Classification Search
CPC ............. G06F 11/1068; G06F 11/076; G06F 11/1012; G06F 11/1044; G06F 11/1048; G06F 11/1448; G06F 15/781; G11C 11/4074; G11C 11/4082; G11C 11/4085; G11C 11/4087; G11C 11/4096; G11C 11/5628; G11C 11/5642; G11C 2029/0411; G11C 16/0483; G11C 16/10;
(Continued)

(56) References Cited

U.S. PATENT DOCUMENTS 8,327,218 B2    12/2012 Lee et al.
8,954,828 B2    2/2015 Torii et al.
(Continued)

FOREIGN PATENT DOCUMENTS

JP    2009-282923 A    12/2009
JP    5703939 B2    4/2015

*Primary Examiner* — James C Kerveros
(74) *Attorney, Agent, or Firm* — Sughrue Mion, PLLC

(57) ABSTRACT

A storage device includes a NAND flash memory device, an auxiliary memory device and a storage controller to control the NAND flash memory device and the auxiliary memory device. The storage controller includes a processor, an error correction code (ECC) engine and a memory interface. The processor executes a flash translation layer (FTL) loaded onto an on-chip memory. The ECC engine generates first parity bits for user data to be stored in a target page of the NAND flash memory device based on error attribute of a target memory region associated with the target page, and selectively generates additional parity bits for the user data under control of the processor. The memory interface transmits the user data and the first parity bits to the NAND flash memory device, and selectively transmits the additional parity bits to the auxiliary memory device.

20 Claims, 28 Drawing Sheets

(51) Int. Cl.
*G11C 11/4074* (2006.01)
*G11C 11/408* (2006.01)
*G11C 11/4096* (2006.01)

(52) U.S. Cl.
CPC ...... *G11C 11/4082* (2013.01); *G11C 11/4085* (2013.01); *G11C 11/4087* (2013.01); *G11C 11/4096* (2013.01)

(58) Field of Classification Search
CPC ... G11C 16/26; G11C 16/3404; G11C 11/005; G11C 29/42; G11C 29/44; Y02D 10/00
USPC .......................................................... 714/764
See application file for complete search history.

(56) References Cited

U.S. PATENT DOCUMENTS

| | | | |
|---|---|---|---|
| 9,059,736 | B2 | 6/2015 | Danilak et al. |
| 9,524,210 | B1* | 12/2016 | Asnaashari ....... H03M 13/2906 |
| 10,459,794 | B2 | 10/2019 | Baek et al. |
| 10,725,864 | B2 | 7/2020 | Takeda et al. |
| 11,687,405 | B2* | 6/2023 | Yoskovits ........... G06F 11/1044 |
| | | | 714/6.21 |
| 2011/0214034 | A1* | 9/2011 | Otsuka ................ G06F 11/1072 |
| | | | 714/E11.03 |
| 2012/0204077 | A1* | 8/2012 | D'Abreu ............. G06F 11/1012 |
| | | | 714/755 |
| 2015/0113311 | A1* | 4/2015 | Nakanishi ........... G06F 11/2028 |
| | | | 714/3 |
| 2017/0123903 | A1* | 5/2017 | Eguchi ................. G06F 11/106 |
| 2022/0029641 | A1* | 1/2022 | Kale ................. H03M 13/2906 |

* cited by examiner

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| LSB | 1 | 0 | 0 | 0 | 1 | 1 | 0 | 0 | 0 | 0 | 0 | 1 | 1 | 1 | 1 | 1 |
| ESB | 1 | 1 | 1 | 0 | 0 | 0 | 0 | 1 | 1 | 0 | 0 | 0 | 0 | 1 | 1 | 1 |
| USB | 1 | 1 | 1 | 1 | 1 | 0 | 0 | 0 | 0 | 0 | 1 | 1 | 0 | 0 | 0 | 1 |
| MSB | 1 | 1 | 0 | 0 | 0 | 0 | 0 | 0 | 1 | 1 | 1 | 1 | 1 | 1 | 0 | 0 |

STORAGE DEVICES AND METHODS OF OPERATING STORAGE DEVICES

CROSS-REFERENCE TO RELATED APPLICATION

This application is based on and claims priority under 35 USC § 119 to Korean Patent Application No. 10-2021-0107892, filed on Aug. 17, 2021, in the Korean Intellectual Property Office (KIPO), the disclosure of which is incorporated in its entirety by reference herein.

BACKGROUND

1. Field

Example embodiments generally relate to memory devices, and more particularly to storage devices and methods of operating storage devices.

2. Discussion of the Related Art

Semiconductor memory devices are classified into a volatile memory and a nonvolatile memory.

Content stored in the volatile memory may be lost when power to the volatile memory is turned off. On the other hand, the nonvolatile memory may retain stored contents even during power-off. A flash memory is a type of nonvolatile memory device, which may have following advantages: mass storage capability, relatively high noise immunity, and low power operation. Therefore, the flash memory devices are employed in various fields. For example, a mobile system such as a smart-phone, or a tablet PC employs the flash memory as storage medium.

As fabrication process of a flash memory device is scaled-down and memory cells of the flash memory device are stacked, the memory cells are degraded and data retention characteristic of the memory cells are degraded.

SUMMARY

Some example embodiments provide a storage device capable of enhancing data retention characteristic of memory cells.

According to an aspect of the disclosure, there is provided a storage device including: a NAND flash memory device; an auxiliary memory device; and a storage controller configured to control the NAND flash memory device and the auxiliary memory device, wherein the storage controller includes: a processor configured to execute a flash translation layer (FTL) loaded onto an on-chip memory of the controller; an error correction code (ECC) engine configured to: generate one or more first parity bits for data to be stored in a target page of the NAND flash memory device based on an error attribute of a target memory region associated with the target page, and selectively generate additional parity bits for the data under control of the processor; and a memory interface configured to: transmit the data and the one or more first parity bits to the NAND flash memory device, and selectively transmit the one or more additional parity bits to the auxiliary memory device.

According to another aspect of the disclosure, there is provided a storage device including: a first NAND flash memory device; an auxiliary memory device; and a storage controller configured to control the first NAND flash memory device and the auxiliary memory device, wherein the storage controller includes: a processor configured to execute a flash translation layer (FTL) loaded onto an on-chip memory; an error correction code (ECC) engine configured to: generate one or more first parity bits for data to be stored in a target page of the first NAND flash memory device based on an error attribute of a target memory region associated with the target page and based on the target page corresponding to a normal page, and generate second parity bits including the one or more first parity bits and one or more additional parity bits for the data based on the target page corresponding to a bad page; and a memory interface configured to: transmit a first portion of a codeword including the data and the second parity bits to the first NAND flash memory device, and transmit a second portion of the codeword to the auxiliary memory device based on the target page corresponding to the bad page, and wherein a first error occurrence probability of the normal page is equal to or smaller than a reference value and a second error occurrence probability of the bad page is greater than the reference value.

According to another aspect of the disclosure, there is provided a storage device including: a NAND flash memory device; an auxiliary memory device; and a storage controller configured to control the NAND flash memory device and the auxiliary memory device, wherein the storage controller includes: a processor configured to execute a flash translation layer (FTL) loaded onto an on-chip memory; a memory interface configured to: receive data and one or more first parity bits from the NAND flash memory device based on a target page of the NAND flash memory device corresponding to a normal page based on an error attribute of a target memory region associated with the target page, and receive one or more additional parity bits for the data based on the target page corresponding to a bad page; and an error correction code (ECC) engine configured to: perform a first mode of ECC decoding on the data and the one or more first parity bits read from the NAND flash memory device to correct errors of the data, based on the target page corresponding to the normal page, perform a second mode of ECC decoding on the data and the one or more first parity bits read from the NAND flash memory device and the one or more additional parity bits read from the auxiliary memory device to correct errors of the data, based on the target page corresponding to the bad page, and wherein a first error occurrence probability of the normal page is equal to or smaller than a reference value and a second error occurrence probability of the bad page is greater than the reference value.

According to another aspect of the disclosure, there is provided a controller including: an error correction code (ECC) engine; a processor configured to control the ECC engine to: generate one or more first parity bits for data to be stored in a target page of a flash memory device based on an error attribute of a target memory region associated with the target page satisfying a first criteria, and generate second parity bits for the data based on the error attribute of the target memory region associated with the target page satisfying a second criteria; and a memory interface configured to: transmit the data and the first parity bits to the flash memory device, and transmit the second parity bits to an auxiliary memory device different from the flash memory.

According to another aspect of the disclosure, there is provided a method performed by controller including: generating, by error correction code (ECC) engine, one or more first parity bits for data to be stored in a target page of a flash memory device based on an error attribute of a target memory region associated with the target page satisfying a first criteria; generating, by the ECC engine, second parity bits for the data based on the error attribute of the target memory region associated with the target page satisfying a second criteria, wherein the second parity bits includes the one or more first parity bits and one or more third parity bits in addition to the one or more first parity bits; transmitting the data and the first parity bits to the flash memory device, and transmitting the additional parity bits to an auxiliary memory device different from the flash memory.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Various example embodiments will be described more fully hereinafter with reference to the accompanying drawings, in which some example embodiments are shown.

Figure 1:
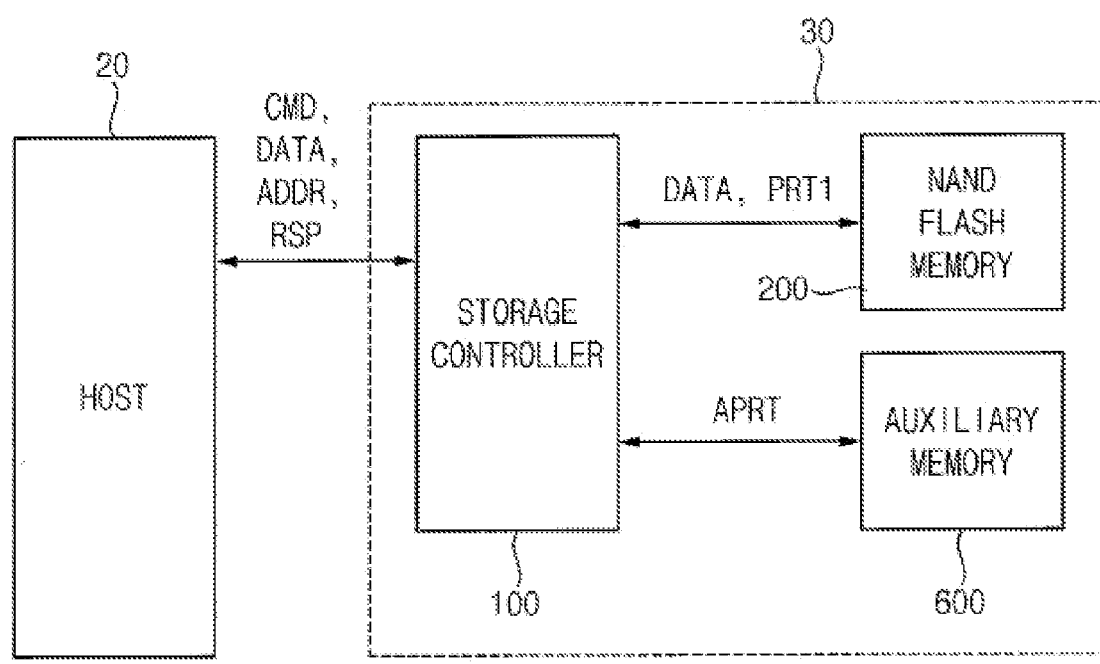
FIG. 1 is a block diagram illustrating an electronic device according to example embodiments.

FIG. 1 is a block diagram illustrating an electronic device according to example embodiments.

Referring to FIG. 1, an electronic device 10 may include a host 20 and a store device 30. The storage device 30 may include a storage controller 100, a NAND flash memory device 200 and an auxiliary memory device 600.

The host 20 may control overall operation of the storage device 30. The storage controller 100 may exchange the signals such as a command CMD, an address ADDR, data DATA, etc. with the host 20. According to an example embodiment, the data DATA may be user data. The storage controller 100 may transmit a response RSP to the host 20 responding to the command CMD.

The storage device 30 may communicate with the host 20 in compliance with one or more interface protocols. For example, the storage device 30 may be a solid state drive (SSD), an embedded memory integrated in the electronic device 10, a memory card removable from the electronic device 10, a secure digital (SD) card, an embedded multimedia card (eMMC), a universal flash storage (UFS) card, etc.

The storage controller 100 may write the user data DATA and first parity bits PRT1 in the NAND flash memory device 200 or read the user data DATA and the first parity bits PRT1 from the NAND flash memory device 200 based on the command CMD from the host 20. The storage controller 100 may write additional parity bits APRT for the user data DATA in the auxiliary memory device 600 or may read the additional parity bits APRT from the auxiliary memory device 600. According to an example embodiment, the storage controller 100 may selectively write additional parity bits APRT in the auxiliary memory device 600 or may selectively read the additional parity bits APRT from the auxiliary memory device 600.

A target page of the NAND flash memory device 200 in which the user data DATA and the first parity bits PRT1 are written may be identified as one of a normal page and a bad page based error attribute of a target memory region including the target page. The bad page may also be referred to as an abnormal page. Error occurrence probability of the normal page may be equal to or smaller than a reference value. Error occurrence probability of the bad page may be greater than the reference value.

The storage controller 100 may generate different number of parity bits based on whether the target page is identified as the normal page or the bad page, may generate the additional parity bits APRT in response to the target page corresponding to the bad page and may store the additional parity bits APRT in the auxiliary memory device 600.

The storage controller 100 may correct errors of the user data DATA to be stored and/or stored in the bad page based on the first parity bits PRT1 and the additional parity bits APRT and thus may increase error correction capability for the bad page. Therefore, the storage controller 100 may enhance data retention characteristic of memory cells of the NAND flash memory device 200 without increasing a size of a memory cell array of the NAND flash memory device 200.

Figure 2A:
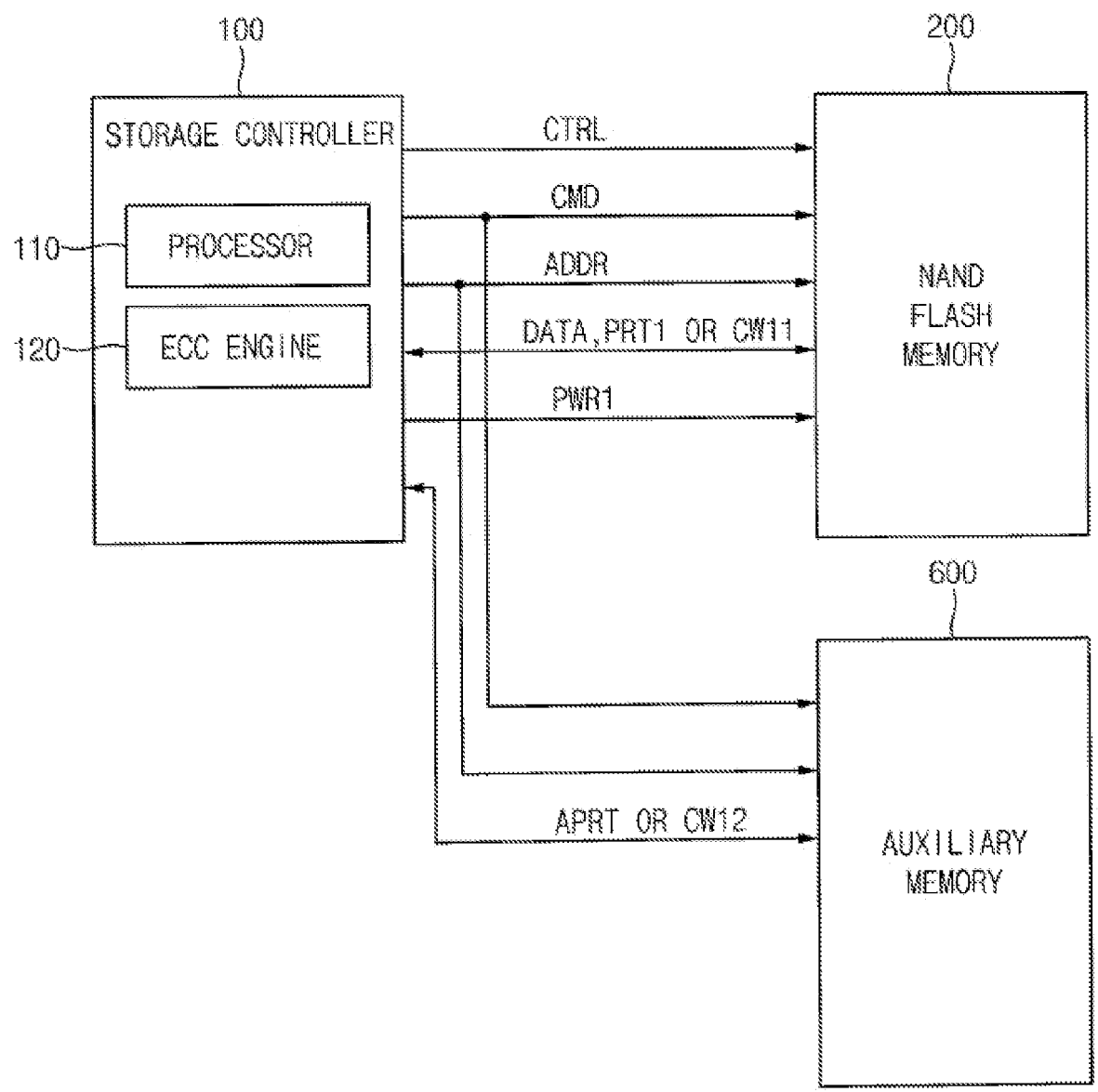
FIG. 2A is a block diagram illustrating an example of the storage device in the electronic device of FIG. 1 according to example embodiments.

FIG. 2A is a block diagram illustrating an example of the storage device in the electronic device of FIG. 1 according to example embodiments.

Referring to FIG. 2A, the storage device 30 may include the storage controller 100 the NAND flash memory device 200 and the auxiliary memory device 600.

In example embodiments, each of the storage controller 100, the NAND flash memory device 200 and the auxiliary memory device 600 may be provided with the form of a chip, a package, or a module. Alternatively, the storage controller 100, the NAND flash memory device 200 and the auxiliary memory device 600 may be packaged one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flat-pack (TQFP), System In Package (SIP), Multi Chip Package (MCP), Wafer-level Fabricated Package (WFP), Wafer-Level Processed Stack Package (WSP) and etc.

The NAND flash memory device 200 may perform an erase operation, a program operation or a write operation under control of the storage controller 100. That is, storage controller 100 may communicate control instructions or control signals to instruct the NAND flash memory device 200 to perform an erase operation, a program operation or a write operation. The NAND flash memory device 200 receives the command CMD, an address ADDR, the user data DATA and the first parity bits PRT1 through input/output lines from the storage controller 100 for performing such operations. In addition, the NAND flash memory device 200 receives a control signal CTRL through a control line from the storage controller 100. In addition, the NAND flash memory device 200 receives a power PWR1 through a power line from the storage controller 100.

The auxiliary memory device 600 may selectively receive the command CMD, the address ADDR and the additional parity bits APRT from the storage controller 100 in response to the target page of the NAND flash memory device 200 corresponding to the bad page.

In an example embodiment, the NAND flash memory device 200 may receive a first portion CW11 of a codeword including the user data DATA, the first parity bits PRT1 and the additional parity bits APRT. In addition, the auxiliary memory device 600 may receive a second portion CW12 of the codeword including the user data DATA, the first parity bits PRT1 and the additional parity bits APRT except the first portion CW11 from the storage controller 100.

An access (write/read operation) unit of the auxiliary memory device 600 may be smaller than an access (write/read operation) unit of the NAND flash memory device 200. The access unit of the NAND flash memory device 200 may correspond to a page and the access unit of the auxiliary memory device 600 may correspond to one of a byte and multiple bytes.

In example embodiments, the auxiliary memory device 600 may include one of a Z-NAND, a phase change random access memory (PRAM), a magnetic random access memory (MRAM) and a dynamic random access memory (DRAM).

Memory cells of the NAND flash memory device 200 have the physical characteristic that a threshold voltage distribution varies due to causes, such as a program elapsed time, a temperature, program disturbance, read disturbance and etc. For example, data stored at the NAND flash memory device 200 becomes erroneous due to the above causes. The storage controller 100 utilizes a variety of error correction techniques to correct such errors. For example, the storage controller 100 includes an error correction code (ECC) engine 120 and a processor 110 to control the ECC engine 120.

During a read operation, the storage controller 100 may read data stored at a first page of the NAND flash memory device 200, using a default read voltage set. The default read voltage set may include predetermined read voltages. The ECC engine 120 may detect and correct errors included in data read from the NAND flash memory device 200. In example embodiments, the ECC engine 120 may be implemented in the form of hardware.

Data read in a read operation may include error bits more than the ECC engine 120 may correct. In this case, the ECC engine 200 fails to correct the errors of the data, which may be referred to as an 'uncorrectable error correction code (UECC) error'. Data having the UECC error may be referred to as an 'UECC data'.

When data read by means of the default read voltage set includes the UECC error, for example, the processor 110 may adjust a read voltage set of the NAND flash memory device 200. The storage controller 100 sends an address ADDR, a command CMD, and a control signal CTRL such that the NAND flash memory device 200 performs a read operation by means of the read voltage set thus adjusted.

The adjusted read voltage set may be included in the control signal CTRL or the command CMD. The ECC engine 120 may detect and correct an error of data that is read using the adjusted read voltage set.

Memory cells may deteriorate due to various factors such as an increase in retention time, occurrence of a read disturb error, a decrease in endurance due to increased program/erase (P/E) cycles, or the like. The degree of degradation of the memory cells may vary for each page that may be program and read operation units. When the read voltage is adjusted in units of a memory block including a plurality of pages without considering degradation of each page, pages with a relatively low degree of degradation, together with pages with a relatively high degree of degradation, may enter a defense code. In this case, since data recovered after entering the defense code may be copied to another memory block by a read reclaim operation, a problem may occur in that a write amplification factor (WAF) increases.

In example embodiments, the processor 110 may control the ECC engine 120 such that the ECC engine 120 may generate different number of parity bits based on whether the target page is identified as the normal page or the bad page, may generate the additional parity bits APRT in response to the target page corresponding to the bad page and may store the additional parity bits APRT in the auxiliary memory device 600. In addition, in a read operation, the processor 110 may control the ECC engine 120 such that the ECC engine 120 may correct errors of the user data DATA stored in the bad page based on the first parity bits PRT1 and the additional parity bits APRT and thus may increase error correction capability for the bad page. Therefore, the storage controller 100 may enhance data retention characteristic of memory cells of the NAND flash memory device 200.

In response to the target page corresponding to the normal page, the ECC engine 120 may generate the first parity bits PRT1 by performing a first mode of ECC encoding on the user data DATA and the storage controller 100 may store the user data DATA and the first parity bits PRT1 in the target page of the NAND flash memory device 200. In response to the target page corresponding to the bad page, the ECC engine 120 may generate the first parity bits PRT1 and the addition parity bits APRT by performing a second mode of ECC encoding on the user data DATA and the storage controller 100 may store the user data DATA and the first parity bits PRT1 in the target page of the NAND flash memory device 200 and may store the addition parity bits APRT in a memory region of the auxiliary memory device 600.

In example embodiments, the store controller 100 may perform a write operation on the NAND flash memory device 200 and a write operation on the auxiliary memory device 600 simultaneously (or, in parallel) and may perform a read operation on the NAND flash memory device 200 and a read operation on the auxiliary memory device 600 simultaneously (or, in parallel). That is, an execution interval of write/read operation on the NAND flash memory device 200 and an execution interval of write/read operation on the auxiliary memory device 600 may be partially overlapped.

Figure 2B:
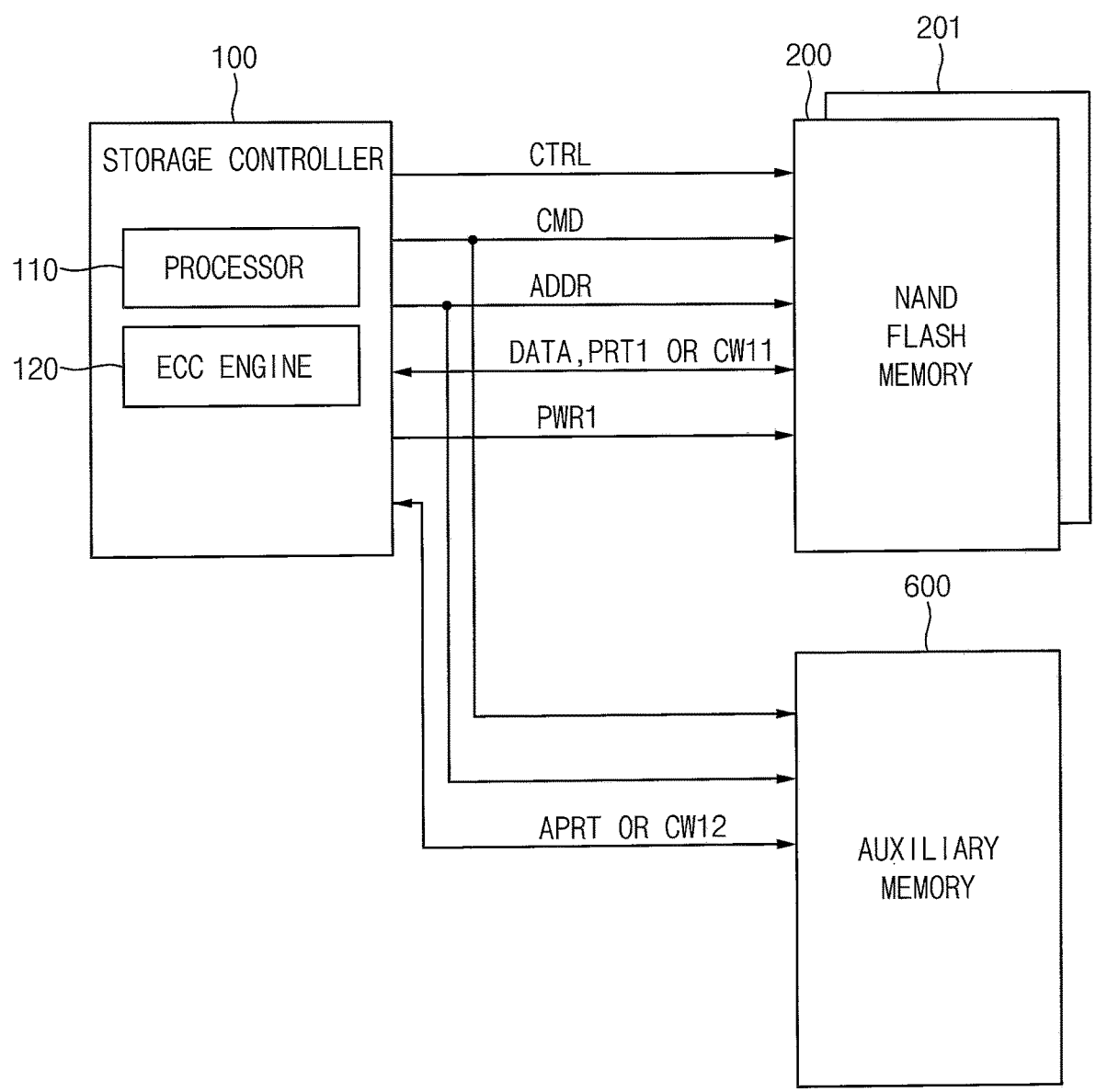
FIG. 2B is a block diagram illustrating another example of the storage device in the electronic device of FIG. 1 according to example embodiments.

FIG. 2B is a block diagram illustrating another example of the storage device in the electronic device of FIG. 1 according to example embodiments.

Referring to FIG. 2B, a storage device 31 may include the storage controller 100 a first NAND flash memory device 200, a second NAND flash memory device 201 and the auxiliary memory device 600.

The storage device 31 of FIG. 2B differs from the storage device 30 of FIG. 2A in that the storage device 31 further includes the second NAND flash memory device 201. Description repeated with FIG. 2A will be omitted.

The first NAND flash memory device 200 may be provided (or, formed) on a first die and the second NAND flash memory device 201 may be provided (or, formed) on a second die different from the first die.

The ECC engine 120 may generate different number of parity bits based on at least one of whether a target memory region in which the user data DATA is to be stored belongs to the first NAND flash memory device 200 and the second NAND flash memory device 201; physical locations of dies on which the first NAND flash memory device 200 and the second NAND flash memory device 201 are provided; and a physical location of a plane to which the target memory region belongs. The cell strings NS11~NS33 in FIG. 8 may be divided into a plurality of planes, and error occurrence probability of the target memory region may be different based on physical location of a plane to which the target memory region belongs.

For example, when the user data DATA is to be stored in the target memory region of the first NAND flash memory device 200, the ECC engine 120 may generate the first parity bits PRT1 by performing a first mode of ECC encoding on the user data DATA and the storage controller 100 may store the user data DATA and the first parity bits PRT1 in the target page of the first NAND flash memory device 200.

For example, when the user data DATA is to be stored in the target memory region of the second NAND flash memory device 201, the ECC engine 120 may generate the first parity bits PRT1 and the addition parity bits APRT by performing a second mode of ECC encoding on the user data DATA and the storage controller 100 may store the user data DATA and the first parity bits PRT1 in the target page of the second NAND flash memory device 201 and may store the addition parity bits APRT in a memory region of the auxiliary memory device 600.

Figure 3:
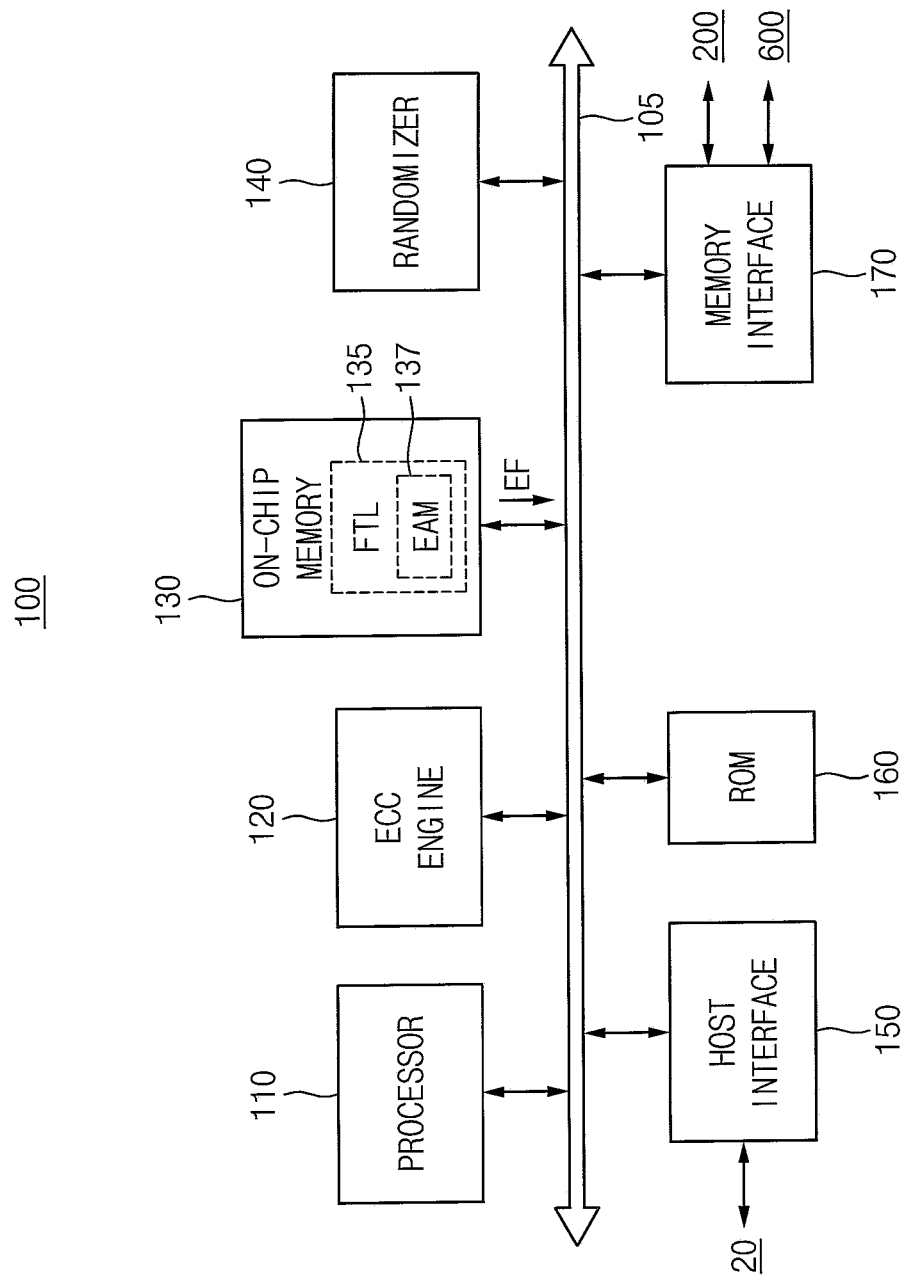
FIG. 3 is a block diagram illustrating the storage controller in the storage device of FIG. 2A or FIG. 2B according to example embodiments.

FIG. 3 is a block diagram illustrating the storage controller in the storage device of FIG. 2A or FIG. 2B according to example embodiments.

Referring to FIGS. 2A and 3, the storage controller 100 may include a processor 110, the ECC engine 120, an on-chip memory 130, a randomizer 140, a host interface 150, a read only memory (ROM) 160 and a memory interface 170 which are connected via a bus 105.

The processor 110 may control an overall operation of the storage controller 100. The processor 110 may control the ECC engine 120, the on-chip memory 130, the randomizer 140, the host interface 150 and the memory interface 170. The processor 110 may include one or more cores (e.g., a homogeneous multi-core or a heterogeneous multi-core). The processor 110 may be or include, for example, at least one of a central processing unit (CPU), an image signal processing unit (ISP), a digital signal processing unit (DSP), a graphics processing unit (GPU), a vision processing unit (VPU), and a neural processing unit (NPU). The processor 111 may execute various application programs loaded onto the on-chip memory 130. According to an example embodiment, the processor 111 may execute a flash translation layer (FTL) 135 loaded onto the on-chip memory 130.

The on-chip memory 130 may store various application programs that are executable by the processor 110. The on-chip memory 130 may operate as a cache memory adjacent to the processor 110. The on-chip memory 130 may store a command, an address, and data to be processed by the processor 110 or may store a processing result of the processor 110. The on-chip memory 130 may be, for example, a storage medium or a working memory including a latch, a register, a static random access memory (SRAM), a dynamic random access memory (DRAM), a thyristor random access memory (TRAM), a tightly coupled memory (TCM), etc.

The processor 110 may execute the FTL 135 loaded onto the on-chip memory 130. The FTL 135 may be loaded onto the on-chip memory 130 as firmware or a program stored in the NAND flash memory device 200. The FTL 135 may manage mapping between a logical address provided from the host 20 and a physical address of the NAND flash memory device 200 and may include an address mapping table manager managing and updating an address mapping table. The FTL 135 may further perform a garbage collection operation, a wear leveling operation, and the like, as well as the address mapping described above. The FTL 135 may be executed by the processor 110 for addressing one or more of the following aspects of the NAND flash memory device 200: overwrite- or in-place write-impossible, a life time of a memory cell, a limited number of program-erase (PE) cycles, and an erase speed slower than a write speed.

The FTL 135 may include an error attribute manager (EAM) 137 that manages error attribute of each of a plurality of memory regions of the NAND flash memory device 200. The error attribute manager EAM 137 may determine whether error occurrence probability of the target page based on error attribute of a target memory region including the target page and address of the target page and may provide the processor 310 and the ECC engine 320 with an error flag EF indicating whether the target page corresponds to the bad page. The error attribute manager EAM 137 may store error attribute of each of a plurality of memory regions of the NAND flash memory device 200 as a form of table.

The ECC engine 120 may generate the first parity bits PRT1 and may selectively generate the additional parity bits APRT by performing an ECC encoding on the user data DATA based on the error flag EF. The ECC engine 120 may perform ECC operations (or ECC encoding and ECC decoding) based on various ECCs such as an LDPC (Low Density Parity Check) code, a BCH (Bose-Chaudhuri-Hocquengh) code, a turbo code, a Reed-Solomon code, a convolution code, and an RSC (Recursive Systematic) code.

The randomizer 140 may randomize data to be stored in the NAND flash memory device 200. For example, the randomizer 140 may randomize data to be stored in the NAND flash memory device 200 by a word-line.

Data randomizing is to process data such that program states of memory cells connected to a word-line have the same ratio. For example, if memory cells connected to one word-line are quad-level cells (QLC) each storing 4-bit data, each of the memory cells may have one of an erase state and first through fifteenth program states. In this case, the randomizer 140 may randomize data such that in memory cells connected to one word-line, the number of memory cells having the erase state, and each of the number of memory cells having the first through fifteenth program states may be substantially the same as one another. For example, memory cells in which randomized data is stored have program states of which the number is equal to one another. The randomizer 140 may de-randomize data read from the NAND flash memory device 200.

The randomizer 140 may randomize page data. For the sake of easy understanding, an ideal operation of the randomizer 140 is described. However, the example embodiment of the disclosure are not limited thereto. As such, according to an example embodiment, the randomizer 140 may randomize data such that in memory cells connected to one word-line, the number of memory cells having the erase state and each of the number of memory cells having the first through fifteenth program states are approximate to the same value. For example, memory cells in which randomized data is stored have program states of which the number may be similar to one another.

The storage controller 100 may communicate with the host 20 through the host interface 150. For example, the host interface 150 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer small interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The storage controller 100 may communicate with the NAND flash memory device 200 and the auxiliary memory device 600 through the memory interface 170.

Figure 4:
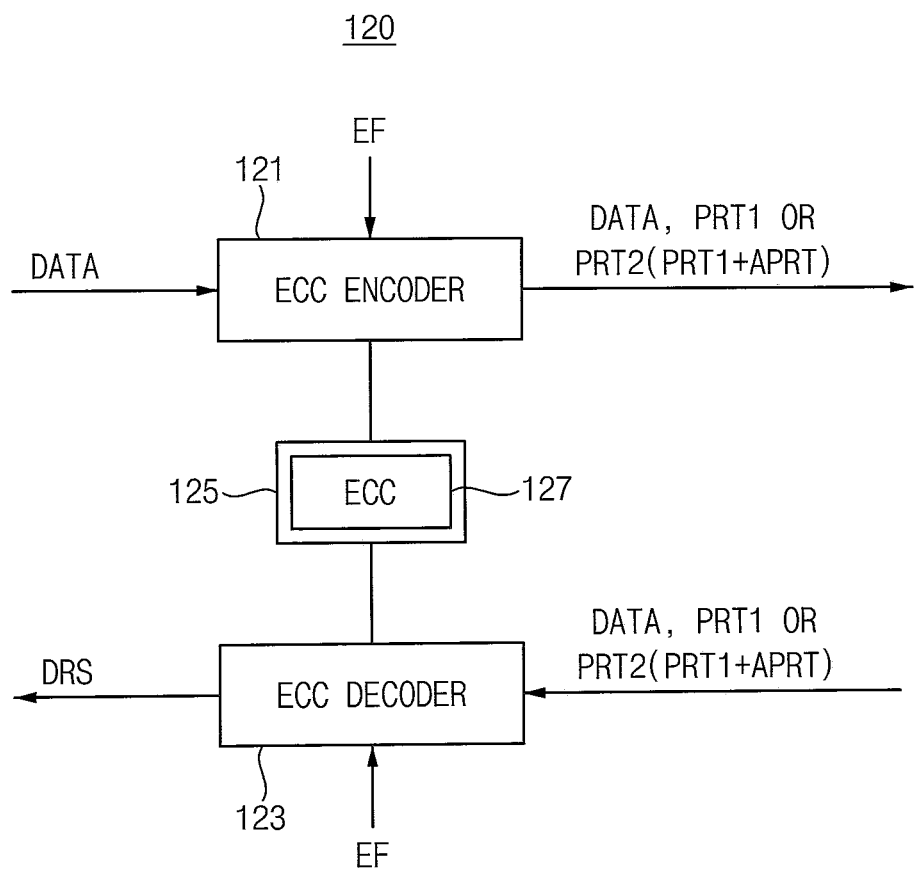
FIG. 4 is a block diagram illustrating an example of the ECC engine in the storage controller of FIG. 3 according to example embodiments.
Figure 5:
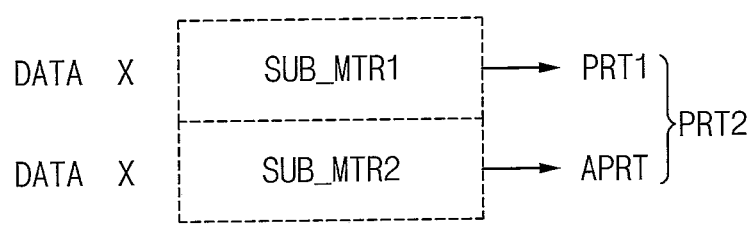
FIG. 5 illustrates an example of parity (check) matrix employed in the ECC engine of FIG. 4 according to example embodiments.

FIG. 4 is a block diagram illustrating an example of the ECC engine in the storage controller of FIG. 3 and FIG. 5 illustrates an example of parity (check) matrix employed in the ECC engine of FIG. 4 according to example embodiments.

Referring to FIG. 4, the ECC engine 120 may include an ECC encoder 121, an ECC decoder 123 and a memory 125. According to an example embodiment, the memory 125 may store an ECC 127 which is represented by a parity matrix.

The ECC encoder 121 may generate the first parity bits PRT1 by performing an ECC encoding on the user data DATA based on the ECC 127 and the error flag EF in a write operation on the normal page and may generate the second parity bits PRT2 including the first parity bits PRT1 and the additional parity bits APRT by performing an ECC encoding on the user data DATA based on the ECC 127 and the error flag EF in a write operation on the bad page.

In a read operation on the normal page, the ECC decoder 123 may receive the user data DATA and the first parity bits PRT1 from the NAND flash memory device 200, may perform a first mode of ECC decoding on the user data DATA and the first parity bits PRT1 based on the ECC 127 and the error flag EF and may provide the processor 110 with a decoding result signal DRS indicating a result of the first mode of ECC decoding.

In a read operation on the bad page, the ECC decoder 123 may receive the user data DATA and the first parity bits PRT1 from the NAND flash memory device 200 and the additional parity bits APRT from the auxiliary memory device 600, may perform a second mode of ECC decoding on the user data DATA, the first parity bits PRT1 and the additional parity bits APRT based on the ECC 127 and the error flag EF and may provide the processor 110 with the decoding result signal DRS indicating a result of the second mode of ECC decoding.

Referring to FIG. 5, a parity matrix HM may include a first sub matrix SUB_MTR1 and a second sub matrix SUB_MTR2. The parity matrix HM may be also referred to as a parity check matrix.

The ECC encoder 121 may generate the first parity bits PRT1 by performing matrix multiplication on the user data DATA and the first sub matrix SUB_MTR1 and the ECC encoder 121 may generate the additional parity bits APRT by performing matrix multiplication on the user data DATA and the second sub matrix SUB_MTR2.

That is, the ECC encoder 121 may generate the first parity bits PRT1 by performing the first mode of ECC encoding on the user data DATA using the first sub matrix SUB_MTR1 in a write operation on the normal page and may generate the second parity bits PRT2 including the first parity bits PRT1 and the additional parity bits APRT by performing the second mode of ECC encoding on the user data DATA using the first sub matrix SUB_MTR1 and the second sub matrix SUB_MTR2 in a write operation on the bad page.

In addition, the ECC decoder 123 may perform the first mode of ECC decoding on the user data DATA and first parity bits PRT1 using the first sub matrix SUB_MTR1 to correct errors in the user data DATA in a read operation on the normal page and may perform the second mode of ECC decoding on the user data DATA, first parity bits PRT1 and the additional parity bits APRT using the first sub matrix SUB_MTR1 and the second sub matrix SUB_MTR2 to correct errors in the user data DATA in a read operation on the bad page.

Figure 6:
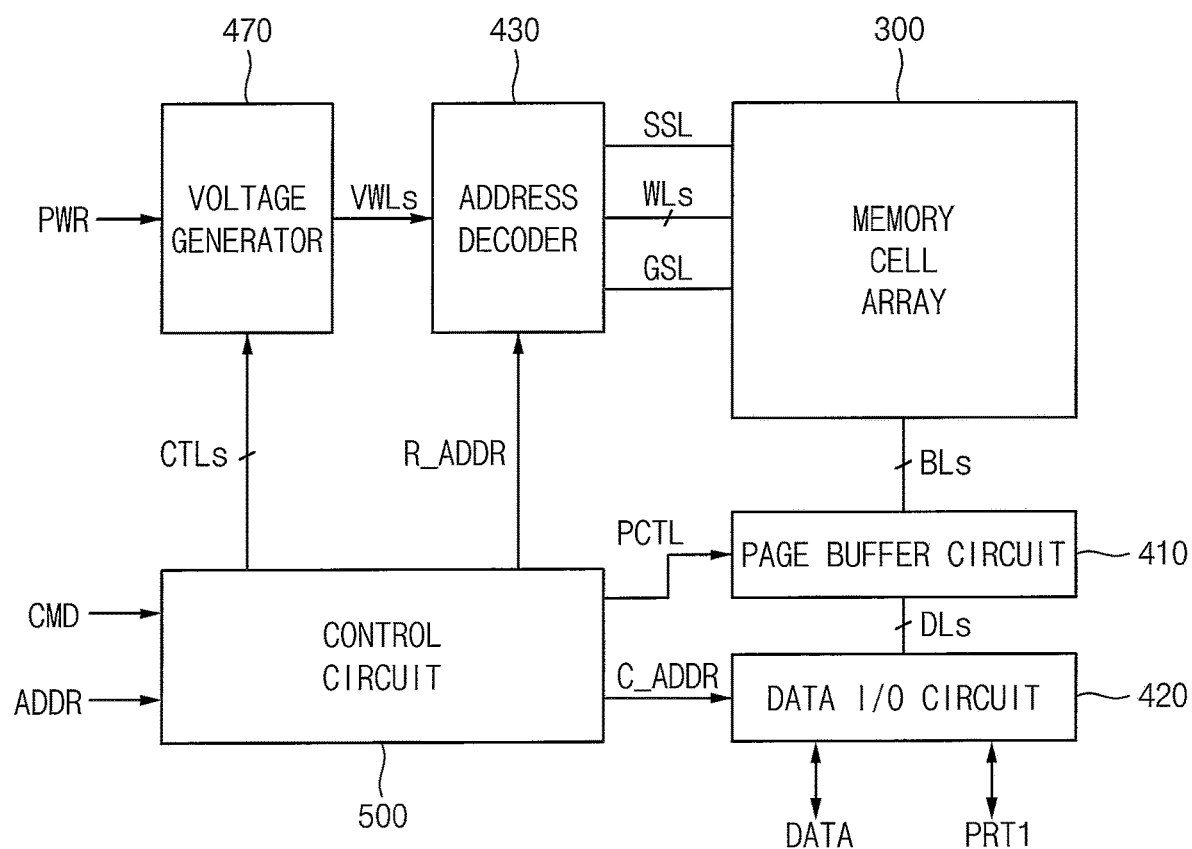
FIG. 6 is a block diagram illustrating the NAND flash memory device in the storage device of FIG. 2A according to example embodiments.

FIG. 6 is a block diagram illustrating the NAND flash memory device in the storage device of FIG. 2A according to example embodiments.

Referring to FIG. 6, the NAND flash memory device 200 includes a memory cell array 300, an address decoder 430, a page buffer circuit 410, a data input/output circuit 420, a control circuit 500 and a voltage generator 470.

The memory cell array 300 may be coupled to the address decoder 430 through a string selection line SSL, a plurality of word-lines WLs, and a ground selection line GSL. In addition, the memory cell array 300 may be coupled to the page buffer circuit 410 through a plurality of bit-lines BLs.

The memory cell array 300 may include a plurality of memory cells coupled to the plurality of word-lines WLs and the plurality of bit-lines BLs.

In some example embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell.

Figure 7:
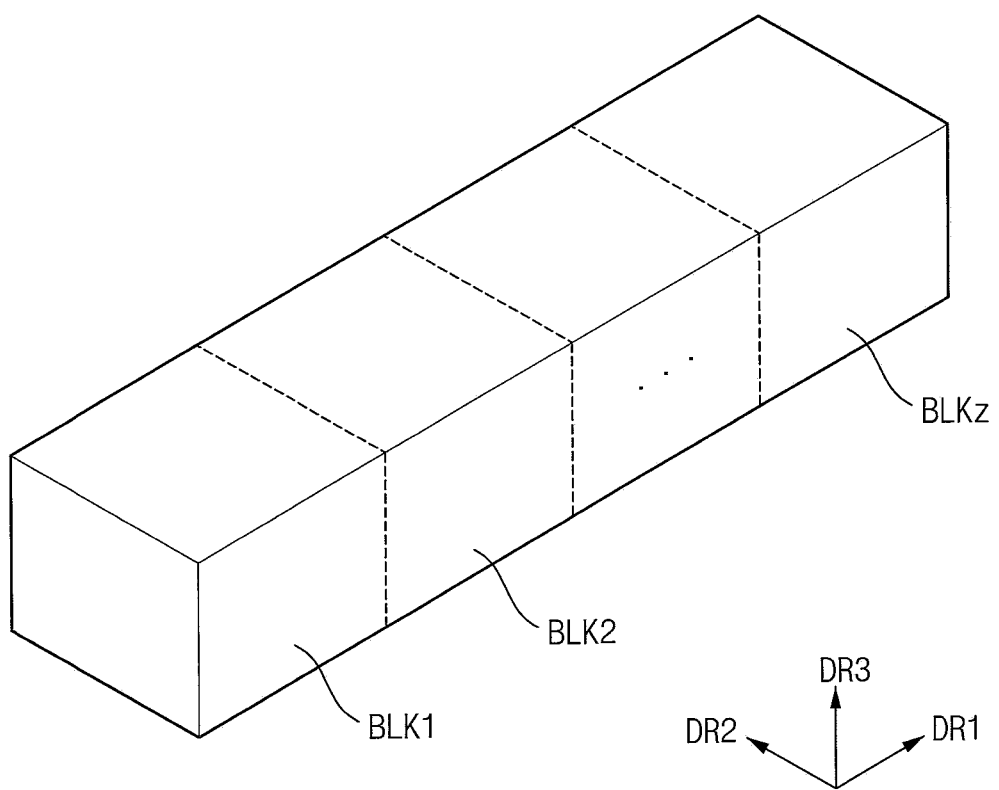
FIG. 7 is a block diagram illustrating the memory cell array in FIG. 6.

FIG. 7 is a block diagram illustrating the memory cell array in FIG. 6.

Referring to FIG. 7, the memory cell array 300 may include a plurality of memory blocks BLK1 to BLKz (z is an integer greater than two) that extends along first through third directions DR1, DR2 and DR3. In an embodiment, the memory blocks BLK1 to BLKz are selected by the address decoder 430 in FIG. 6. For example, the address decoder 430 may select a memory block BLK corresponding to a block address among the memory blocks BLK1 to BLKz.

Figure 8:
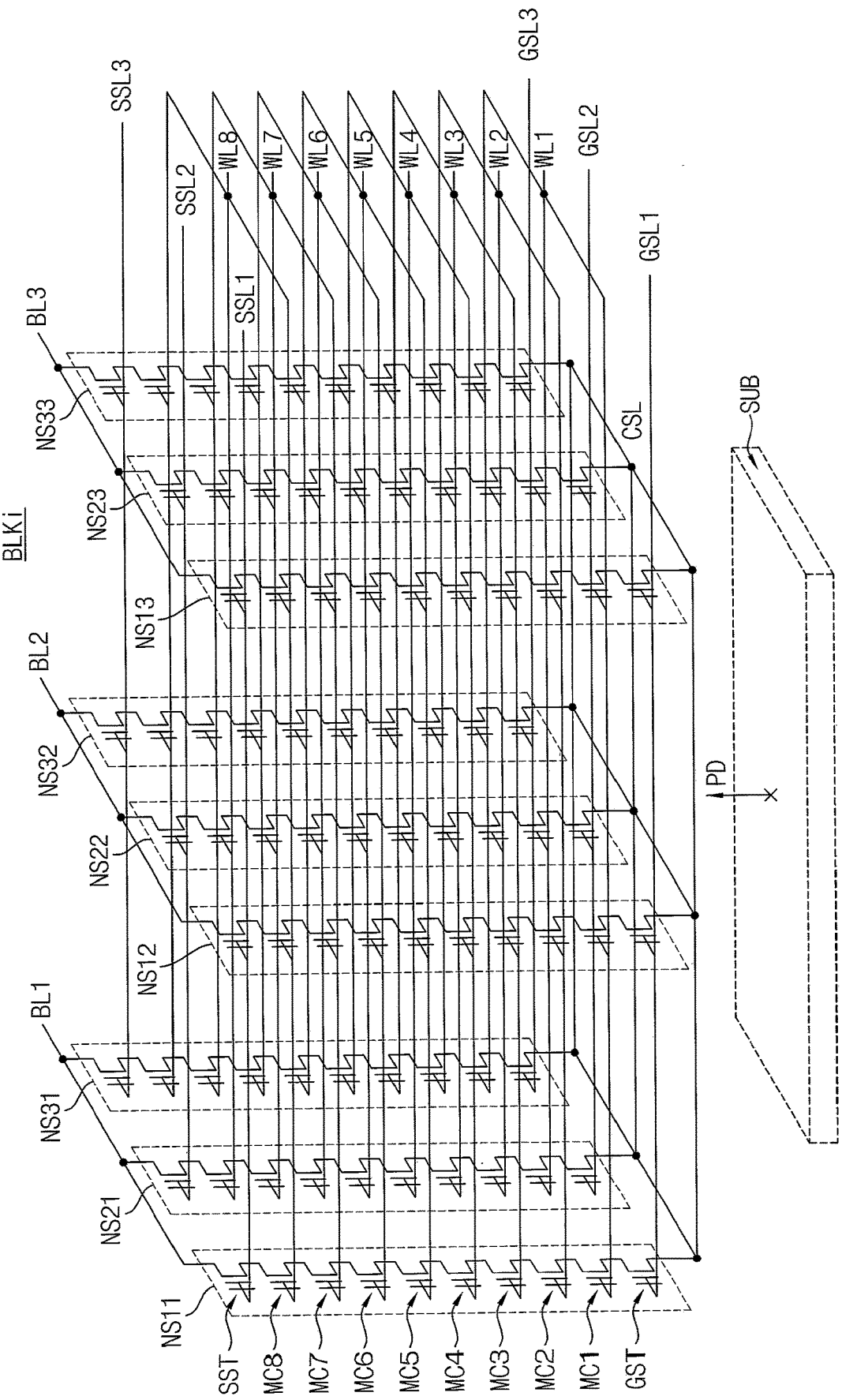
FIG. 8 is a circuit diagram illustrating one of the memory blocks in FIG. 7.

FIG. 8 is a circuit diagram illustrating one of the memory blocks in FIG. 7.

The memory block BLKi of FIG. 8 may be formed on a substrate in a three-dimensional structure (or a vertical structure). For example, a plurality of memory cell strings included in the memory block BLKi may be formed in a direction PD perpendicular to a substrate SUB. The direction PD may correspond to the third direction DR3.

Referring to FIG. 8, the memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, example embodiments are not limited thereto. In some example embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 8, the memory block BLKi is illustrated to be coupled to eight word-lines WL1 to WL8 and three bit-lines BL1 to BL3. However, example embodiments are not limited thereto. In some example embodiments, the memory cell array 300 may be coupled to any number of word-lines and bit-lines.

Figure 9:
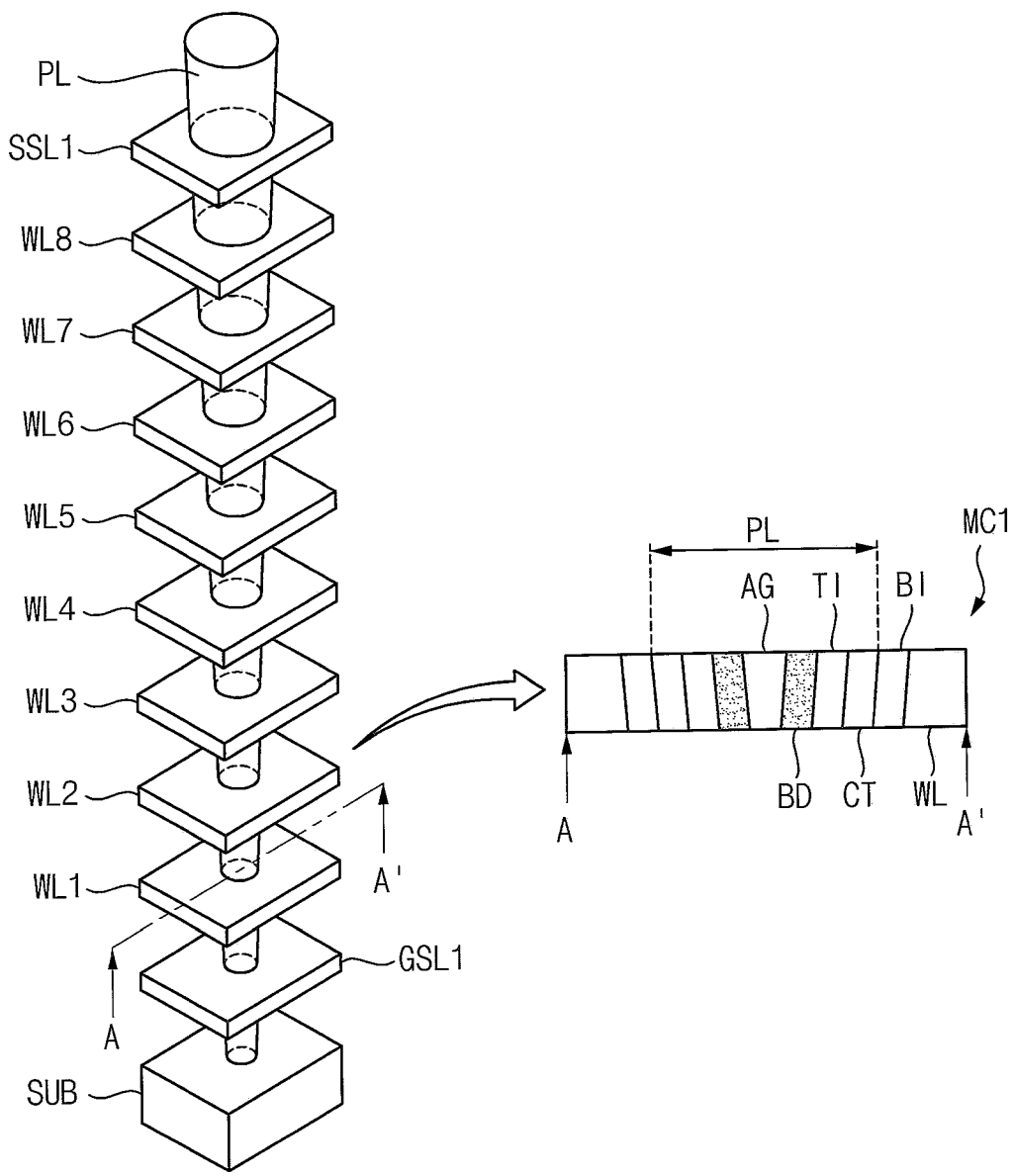
FIG. 9 illustrates an example of a structure of a cell string in the memory block of FIG. 8.

FIG. 9 illustrates an example of a structure of a cell string in the memory block of FIG. 8.

Referring to FIGS. 8 and 9 a pillar PL is provided on the substrate SUB in the cell string NS11 such that the pillar PL extends in a direction perpendicular to the substrate SUB to make contact with the substrate SUB. Each of the ground selection line GSL1, the word-lines WL1 to WL8, and the string selection lines SSL illustrated in FIG. 9 may be formed of a conductive material parallel with the substrate SUB, for example, a metallic material. The pillar PL may be in contact with the substrate SUB through the conductive materials forming the string selection lines SSL, the word-lines WL1 to WL8, and the ground selection line GSL.

A sectional view taken along a line A-A' is also illustrated in FIG. 9. In an embodiment, a sectional view of a first memory cell MC1 corresponding to a first word-line WL1 is illustrated. The pillar PL may include a cylindrical body BD. An air gap AG may be defined in the interior of the body BD.

The body BD may include P-type silicon and may be an area where a channel will be formed. The pillar PL may further include a cylindrical tunnel insulating layer TI surrounding the body BD and a cylindrical charge trap layer CT surrounding the tunnel insulating layer TI. A blocking insulating layer BI may be provided between the first word-line WL and the pillar PL. The body BD, the tunnel insulating layer TI, the charge trap layer CT, the blocking insulating layer BI, and the first word-lines WL may constitute a charge trap type transistor that is formed in a direction perpendicular to the substrate SUB or to an upper surface of the substrate SUB. A string selection transistor SST, a ground selection transistor GST, and other memory cells may have the same structure as the first memory cell MC1.

Referring back to FIG. 6, the control circuit 500 may receive a command (signal) CMD and an address (signal) ADDR from the storage controller 100 and may control an erase loop, a program loop and a read operation of the NAND flash memory device 200 based on the command signal CMD and the address signal ADDR. The program loop may include a program operation and a program verification operation. The erase loop may include an erase operation and an erase verification operation.

For example, the control circuit 500 may generate control signals CTLs, which are used for controlling the voltage generator 470 and a control signal PCTL (i.e., page buffer control signal) for controlling the page buffer circuit 410, based on the command signal CMD, and generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 300 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generator 470 may generate word-line voltages VWLs, which are required for the operation of the NAND flash memory device 200, based on the control signals CTLs from the control circuit 500. The voltage generator 470 may receive the power PWR from the storage controller 100. The word-line voltages VWLs may be applied to the plurality of word-lines WLs through the address decoder 430.

For example, during the erase operation, the voltage generator 470 may apply an erase voltage to a well of the memory block and may apply a ground voltage to entire word-lines of the memory block. During the erase verification operation, the voltage generator 470 may apply an erase verification voltage to the entire word-lines of the memory block or sequentially apply the erase verification voltage to word-lines in a word-line basis.

For example, during the program operation, the voltage generator 470 may apply a program voltage to the selected word-line and may apply a program pass voltage to the unselected word-lines. In addition, during the program verification operation, the voltage generator 470 may apply a program verification voltage to the selected word-line and may apply a verification pass voltage to the unselected word-lines.

In addition, during the default read operation, the voltage generator 470 may apply a default read voltage to the selected word-line and may apply a read pass voltage to the unselected word-lines. During the recovery read operation, the voltage generator 470 may apply the optimal read level voltage to the selected word-line.

Although not illustrated, the voltage generator 470 may apply an inhibit voltage to the defective bit-lines such that memory cells coupled to the bit-lines are prevented from being programmed.

The page buffer circuit 410 may be coupled to the memory cell array 300 through the plurality of bit-lines BLs. The page buffer circuit 410 may include a plurality of page buffers. In some example embodiments, one page buffer may be connected to one bit-line. In other example embodiments, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 420 may receive user data DATA and the first parity bits PRT1 from the storage controller 100 and provide the user data DATA and the first parity bits PRT1 to the page buffer circuit 410 based on the column address C_ADDR received from the control circuit 500. During the read operation, the data input/output circuit 420 may provide the user data DATA and the first parity bits PRT1, which are stored in the page buffer circuit 410, to the storage controller 100 based on the column address C_ADDR received from the control circuit 500.

Figure 10:
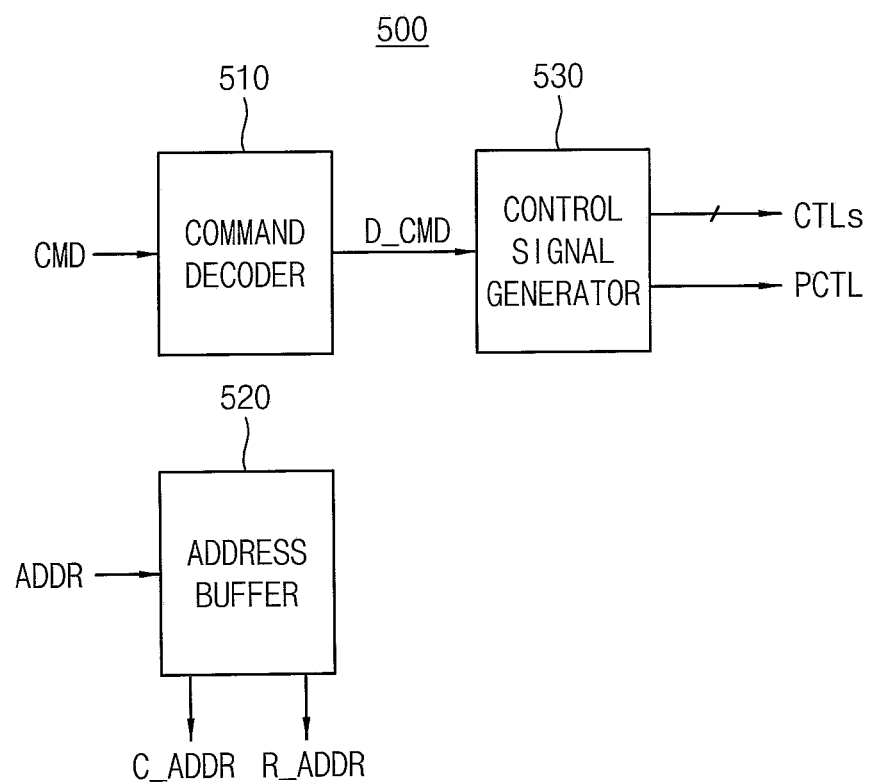
FIG. 10 is a block diagram illustrating the control circuit in the NAND flash memory device of FIG. 6 according to example embodiments.

FIG. 10 is a block diagram illustrating the control circuit in the NAND flash memory device of FIG. 6 according to example embodiments.

Referring to FIG. 10, the control circuit 500 may include a command decoder 510, an address buffer 520 and a control signal generator 530.

The command decoder 510 may decode the command CMD and may provide a decoded command D_CMD to the control signal generator 530. The address buffer 520 may receive the address signal ADDR, may provide the row address R_ADDR to the address decoder 430 and may provide the column address C_ADDR to the data input/output circuit 420.

The control signal generator 530 may receive the decoded command D_CMD, may generate the control signals CTLs based on an operation directed by the decoded command D_CMD and may provide the control signals CTLs to the voltage generator 470. In addition, the control signal generator 530 may generate the control signal PCTL based on the based on an operation directed by the decoded command D_CMD, and may provide the control signal PCTL to the page buffer circuit 410.

Figure 11:
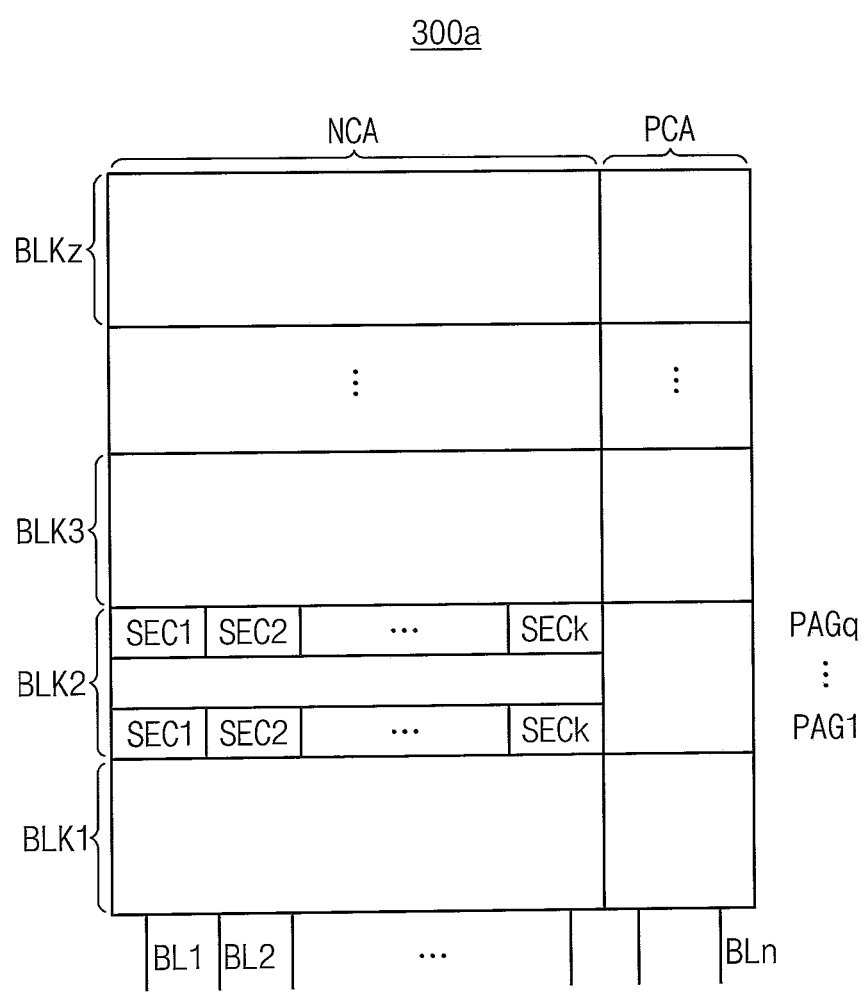
FIG. 11 is a block diagram illustrating an example of the memory cell array in the nonvolatile memory device of FIG. 6 according to example embodiments.

FIG. 11 is a block diagram illustrating an example of the memory cell array in the nonvolatile memory device of FIG. 6 according to example embodiments.

Referring to FIG. 11, a memory cell array 300a may include a plurality of memory blocks BLK1~BLKz. Each of the plurality of memory blocks BLK1~BLKz may include a plurality of pages PAG1~PAGq (q is an integer equal to or greater than 2).

The memory cell array 300a may include a normal cell region NCA to store the user data DATA and a parity cell region PCA to store the first parity bits PRT1.

Memory cells of the normal cell region NCA and the parity cell region PCA may be coupled to first bit-lines BL1~BLn (n is an integer equal to or greater than 4). Each of the pages in the normal cell region NCA and the parity cell region PCA may include a plurality of sectors SEC1 through SECk (k is an integer equal to or greater than 3).

Figure 12A:
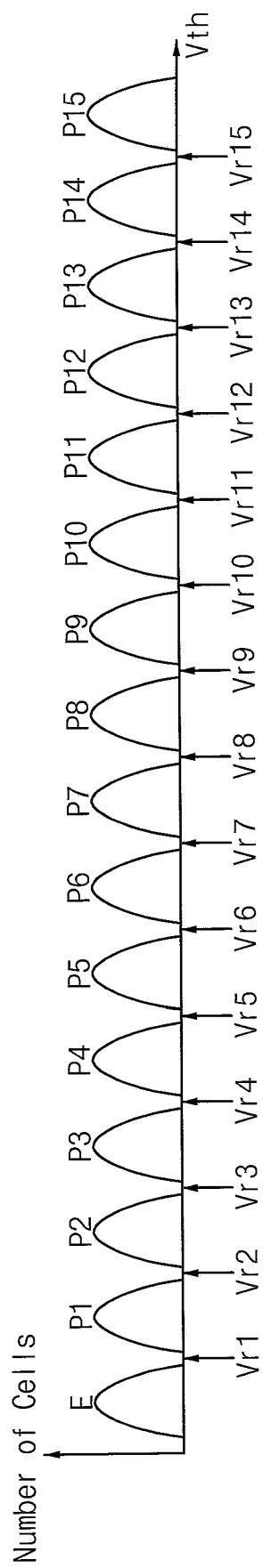
FIG. 12A is a graph showing a threshold voltage distribution of memory cells when a memory cell included in the memory cell array in FIG. 12 is a 4-bit quadrature level cell.

FIG. 12A is a graph showing a threshold voltage distribution of memory cells when a memory cell included in the memory cell array is a 4-bit quadrature level cell (QLC).

Referring to FIG. 12A, a horizontal axis represents a threshold voltage Vth and the vertical axis represents the number of memory cells. When each of the memory cells is a 4-bit quadrature level cell programmed to store 4 bits, the memory cell may have one from among an erase state E and first through fifteenth program states P1 through P15. When a memory cell is a multi-level cell, unlike a single-level cell, since an interval between threshold voltages distributions is small, a small change in the threshold voltage Vth may cause a big problem.

A first read voltage Vr1 has a voltage level between a distribution of a memory cell having the erase state E and a distribution of a memory cell having the first program state P1. Each of second through fifteenth read voltages Vr2 through Vr15 have a voltage level between distributions of memory cells having adjacent program states.

In example embodiments, assuming that the first read voltage Vr1 is applied, when a memory cell is turned on, data '1' may be stored, and when the memory cell is turned off, data '0' may be stored. However, the example embodiment of the disclosure are not limited thereto, and as such, according to other example embodiments, assuming that the first read voltage Vr1 is applied, when a memory cell is turned on, data '0' may be stored, and when the memory cell is turned off, data '1' may be stored. As such, a logic level of data may vary according to the example embodiment of the disclosure.

Figure 12B:
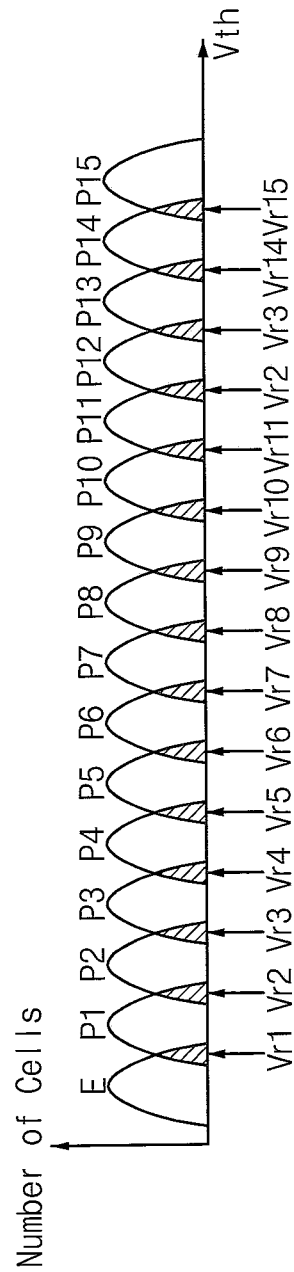
FIG. 12B is a graph showing a case where a threshold voltage of a memory cell in the graph of FIG. 12A is changed.

FIG. 12B is a graph showing a case where a threshold voltage of a memory cell in the graph of FIG. 12A is changed.

Referring to FIG. 12B, memory cells respectively programmed to the erase state E and the first through fifteenth program states P1 through P15 may have a changed distribution as shown in FIG. 12B according to a read environment. In FIG. 12B, memory cells belonging to hatched portions may have read errors, thereby reducing the reliability of a nonvolatile memory device.

For example, when a read operation is performed on a memory device by using the first read voltage Vr1, although memory cells included in a hatched portion are programmed to the first program state P1, the memory cells may be determined to have the erase state E due to a decrease in the threshold voltage Vth. Accordingly, an error may occur in the read operation, thereby reducing the reliability of the nonvolatile memory device.

When data is read from the NAND flash memory device 200, a raw bit error rate (RBER) may vary according to a voltage level of a read voltage. An optimum or, alternatively, desirable voltage level of a read voltage may be determined according to a distribution pattern of the memory cells. Accordingly, as a distribution of the memory cells changes, an optimum or, alternatively, desirable voltage level of a read voltage needed to read data from the nonvolatile memory device may change. Accordingly, in order to rapidly determine an optimum or, alternatively, desirable level of a read voltage in consideration of a read environment of the nonvolatile memory device to rapidly perform a read operation, a defense code may be required to be selectively executed.

Figures 12C, 13:
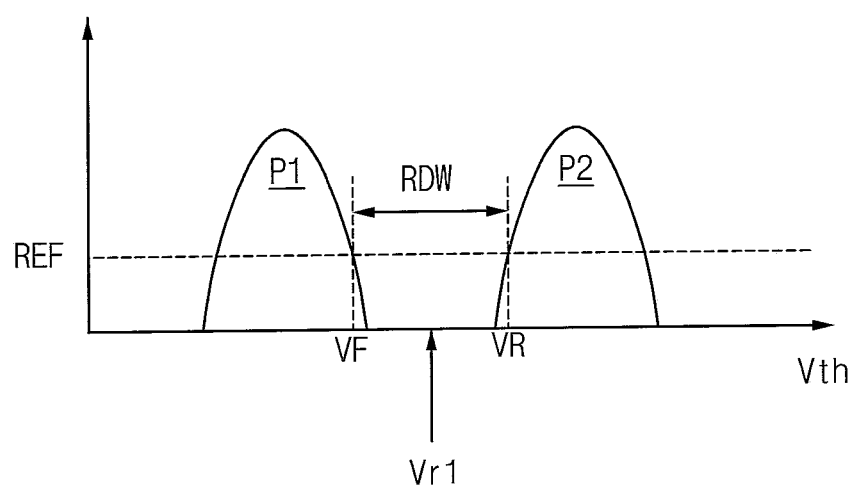
FIG. 12C illustrates a table for explaining bit mapping for programming memory cells according to example embodiments.
FIG. 13 is a graph showing enlarged first and second program states of FIG. 12A.

FIG. 12C illustrates a table for explaining bit mapping for programming memory cells according to example embodiments.

For convenience of explanation, the present embodiment assumes a case where a memory cell is a QLC. However, in other embodiments the memory cell may be a different type other than a QLC.

Referring to FIG. 12C, when memory cells are QLCs, each of the memory cells may store an LSB, an ESB, an upper significant bit (USB), and an MSB. Further referring to FIG. 8, LSBs stored in memory cells in a first row from among the memory cells connected to the word-line WL1 may form a first page, and MSBs stored therein may form a fourth page. USBs stored in the memory cells in the first row from among the memory cells connected to the word-line WL1 may form a third page, and ESB stored therein may form a second page.

FIG. 13 is a graph showing enlarged first and second program states of FIG. 12A.

Referring to FIG. 13, a read window RDW between the first and second program states P1 and P2 may be defined as a difference between a fall voltage VF corresponding to the first program state P1 and a rise voltage VR corresponding to the second program state P2. Here, the fall voltage VF may represent a threshold voltage where the number of "off" cells corresponds to a reference number REF, based on an "off" cell count result for memory cells programmed to the first program state P1. The rise voltage VR may represent a threshold voltage where the number of "off" cells corresponds to the reference number REF, based on an "off" cell count result for memory cells programmed to the second program state P2. A read voltage Vr1 for determining the second program state P2 should have a voltage level within the read window RWD, and in order to decrease a read error, the read window RWD should be sufficiently widely secured.

Figure 14:
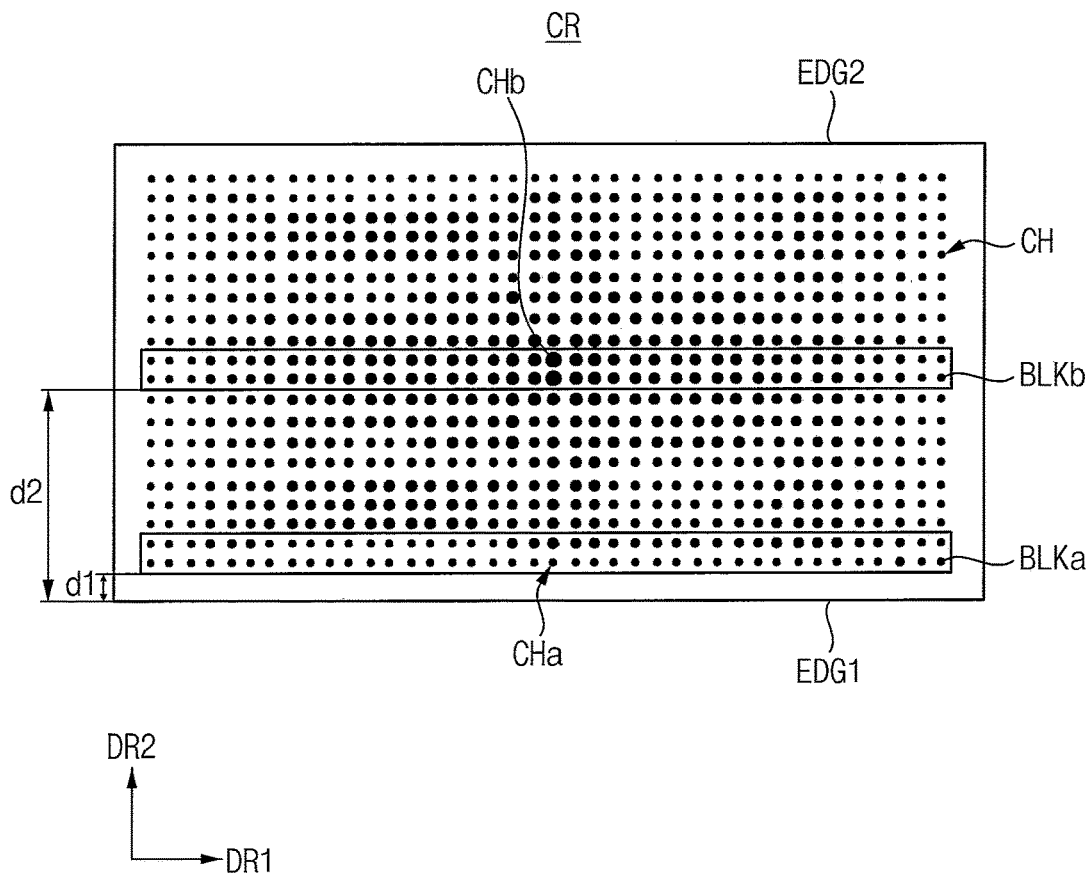
FIG. 14 illustrates a cell region in which the memory cell array of FIG. 7 is formed according to example embodiments.

FIG. 14 illustrates a cell region in which the memory cell array of FIG. 7 is formed according to example embodiments.

Referring to FIG. 14, a cell region CR includes a plurality of channel holes CH.

A channel hole size, for example, a channel hole diameter, may be varied according to positions within the cell region CR. For example, channel holes CH adjacent to the first and second edges EDG1 and EDG2 have a low peripheral density, and thus may have a different diameter from those of other channel holes CH. A memory block BLKa may be adjacent to the second edge EDG2, and may be spaced apart from the second edge EDG2 by a first distance d1. A memory block BLKb may not be adjacent to the first and second edges EDG1 and EDG2, and be in a center of the cell region CR, and may be spaced apart from the second edge EDG2 by a second distance d2. The second distance d2 may be greater than the first distance d1. A first diameter D1 of a first channel hole CHa included in the memory block BLKa may be smaller than a second diameter D2 of a second channel hole CHb included in the memory block BLKb.

Figure 15A:
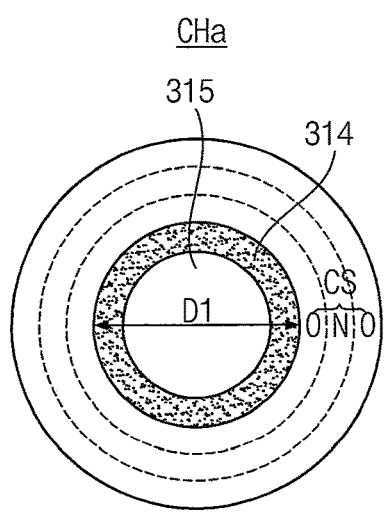
FIGS. 15A and 15B illustrate cross-sections of strings of the memory blocks BLKa and BLKb of FIG. 14, respectively.
Figure 15B:
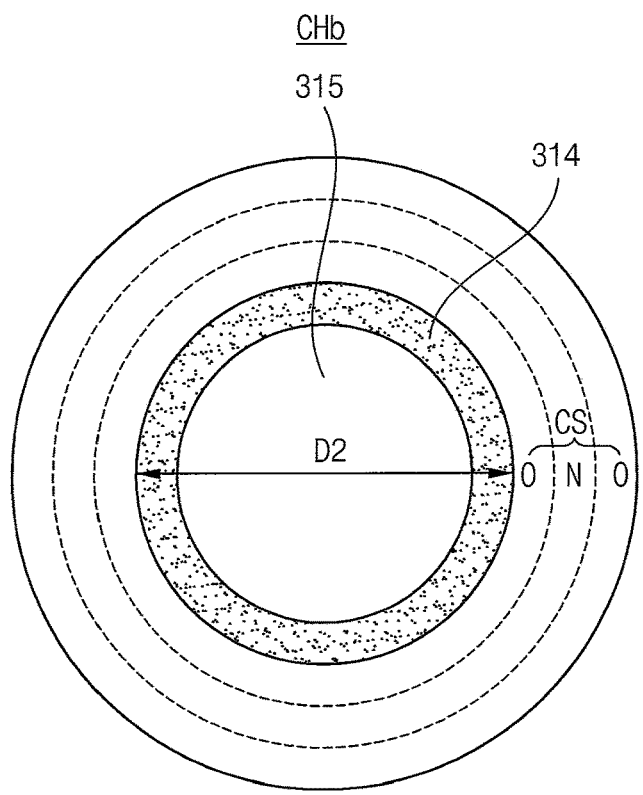

FIGS. 15A and 15B illustrate cross-sections of strings of the memory blocks BLKa and BLKb of FIG. 14, respectively.

Referring to FIG. 15A, a pillar including a channel layer 314 and an internal layer 315 may be formed in the first channel hole CHa included in the memory block BLKa, and a charge storage layer CS may be formed around the first channel hole CHa, and the charge storage layer CS may have an (oxide-nitride-oxide) ONO structure.

Referring to FIG. 15B, a pillar including a channel layer 314 and an internal layer 315 may be formed in the second channel hole CHb included in the memory block BLKb, and a charge storage layer CS may be formed around the second channel hole CHb, and the charge storage layer CS may have an ONO structure.

In an example embodiment, a thickness of the charge storage layer CS included in the memory block BLKb may be different from a thickness of the charge storage layer CS included in the memory block BLKa. Characteristics of memory cells may vary due to the difference in the channel hole diameters. For example, in a NAND flash nonvolatile memory device having a gate all around structure in which a gate electrode is disposed around a circumference of a channel hole, if a channel hole diameter is reduced, the magnitude of an electric field formed between a gate electrode and a channel region 314 is increased. Thus, program and erase speeds of a memory cell having a relatively small channel hole diameter like the first channel hole CHa may be higher than those of a memory cell having a relatively large channel hole diameter like the second channel hole CHb.

Referring back to FIG. 14, a memory block is formed in the cell region CR to include all memory cells corresponding to one page in the first direction DR1, that is, in a word-line direction, and to include some strings in the second direction DR2, that is, in a bit-line direction. Thus, each memory block extends in the first direction DR1, and channel hole sizes, that is, channel hole diameters may differ in units of memory blocks. Thus, program and erase speeds of memory cells included in the memory block BLKa may be higher than program and erase speeds of memory cells included in the memory block BLKb.

Figure 16A:
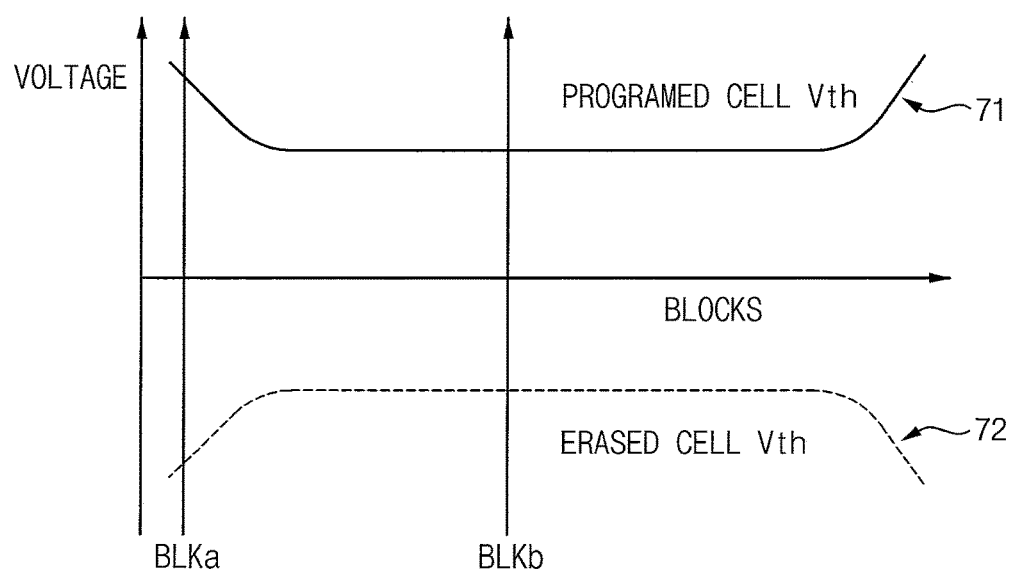
FIG. 16A is a graph showing a result of performing a program operation and an erase operation on the memory blocks in FIG. 14.

FIG. 16A is a graph showing a result of performing a program operation and an erase operation on the memory blocks in FIG. 14.

Referring to FIG. 16A, a horizontal axis denotes positions of memory blocks in the second direction DR2, that is, a bit-line direction, and a vertical axis denotes a threshold voltage. For example, a solid line 71 denotes a central value of threshold voltages according to memory block positions of a programmed memory cell, and a dotted line 72 denotes a central value of threshold voltages according to memory block positions of an erased memory cell.

As described above, the threshold voltage distribution, as indicated by the solid line 71, of programmed memory cells may have a U shape. In addition, the threshold voltage distribution, as indicated by the dotted line 72, of erased memory cells may have an inverted U.

Figure 16B:
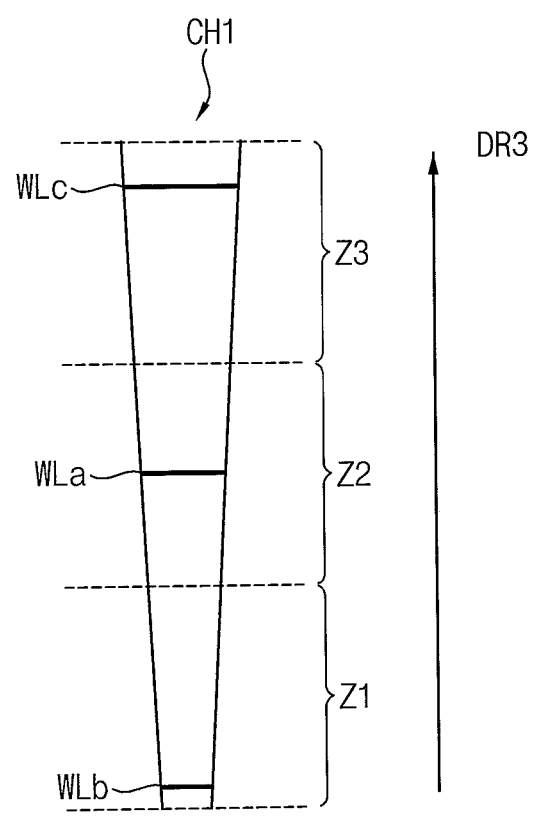
FIG. 16B illustrates an example of a vertical structure in FIG. 14.

FIG. 16B illustrates an example of a vertical structure in FIG. 14.

Referring to FIG. 16B, a channel hole CH1 corresponding to a string included in a NAND flash memory device is illustrated. As described above, the channel hole CH1 is formed by etching portions of gate electrodes and insulation layers stacked on a substrate, and thus, the channel hole CH1 may be a tapered etching profile where a diameter of the channel hole CH1 is becoming downwardly smaller. Thus, a diameter of the channel hole CH1 may be smaller towards the substrate.

In an example embodiment, the channel hole CH1 may be divided into three zones according to channel hole diameters. For example, a zone in which a channel hole diameter is smaller than a first value may be referred to as a first zone Z1, and a zone in which a channel hole diameter is equal to or greater than the first value and smaller than a second value may be referred to as a second zone Z2, and a zone in which a channel hole diameter is equal to or greater than the second value and smaller than a third value may be referred to as a third zone Z3. Therefore, characteristic of memory cells included in one channel hole may be different according to positions along the third direction DR3.

A word-line WLb is provided in the first zone Z1, a word-line WLa is provided in the second zone Z2, and a word-line WLc is provided in the third zone Z3. Because the word-line WLb is adjacent to a lower edge of the channel hole CH1, the word-line WLb is adjacent to a ground selection line or the substrate, a probability of bridge occurring between the word-line WLb and the channel. When the bridge occurs between the word-line WLb and the channel, a current leakage may occur through the bridge and program/read operation and erase operation may operate abnormally in the word-line WLb due to the bridge.

Because the word-line WLc is adjacent to an upper edge of the channel hole CH1, the word-line WLc is adjacent to a string selection line or the substrate, a probability of bridge occurring between the word-line WLc and the channel.

Error occurrence probability of pages coupled to the word-line WLc which is adjacent to an upper edge of the channel hole CH1 or coupled to the word-line WLb which is adjacent to the lower edge of the channel hole CH1 may be greater than error occurrence probability of pages coupled to the word-line WLa which is disposed at a center region of the channel hole CH1.

FIGS. 12C, 13, 14, 15A, 14B, 16A and 16B are for explaining that error attribute of the target memory region may be different based on a location of the target memory region and the data and occurrence probability of the target page may be different based on the error attribute.

For example, error occurrence probability of pages belonging to the first zone Z1 (e.g., greater diameter of the channel hole) may be greater than error occurrence probability of pages belonging to the third zone Z3 (e.g., smaller diameter of the channel hole). For example, error occurrence probability of QLC pages or TLC pages may be greater than error occurrence probability of MLC pages or SLC pages. For example, error occurrence probability of pages having smaller read window may be greater than error occurrence probability of pages having greater read window.

For example, error occurrence probability of pages having greater overlapping portions of threshold voltages may be greater than error occurrence probability of pages having smaller overlapping portions of threshold voltages. For example, error occurrence probability of pages associated with a word-line having greater striation may be greater than error occurrence probability of pages associated with a word-line having smaller striation. That is, error attribute of each of the target pages may be associated with physical location of a target memory region including the target page and/or data bit.

Information on a bad page and a normal page may be stored in the error attribute manager 137 in the FTL 135 in the on-chip memory 130. Error occurrence probability of the bad page may be greater than a reference value and the error occurrence probability of the normal page may be smaller than or equal to the reference value. Information on good page whose error occurrence probability is greater than the error occurrence probability of the normal page may be stored in the error attribute manager EAM 137 in the FTL 135.

Figure 17:
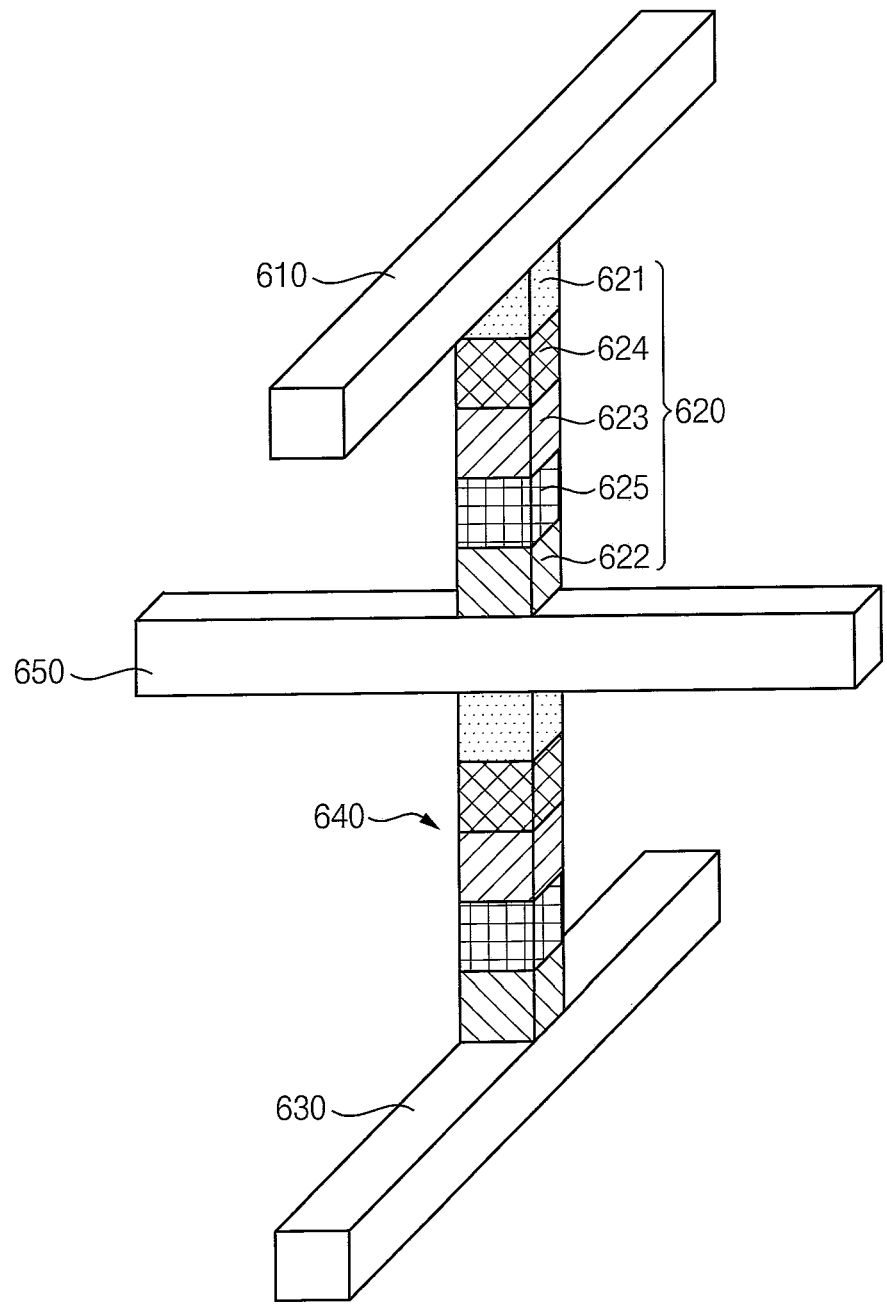
FIG. 17 is a block diagram illustrating an example of the auxiliary memory device in the storage device of FIG. 2A according to example embodiments.

FIG. 17 is a block diagram illustrating an example of the auxiliary memory device in the storage device of FIG. 2A according to example embodiments.

Referring to FIG. 17, an auxiliary memory device 600a may include a first word-line 610 and a second word-line 630 extending in the second direction DR and spaced apart from each other in the third direction DR3 perpendicular to the first direction DR1, and a bit-line 650 disposed between the first word-line 610 and the second word-line 630 and extending in the first direction DR1, which is perpendicular to the second direction DR2 and the third direction DIR3. In addition, the auxiliary memory device 600a may include a first memory cell 620 disposed between the first word-line 610 and the bit-line 650, and a second memory cell 640 disposed between the bit-line 650 and the second word-line 630.

The first memory cell 620 may include first to third electrodes 621 to 623, a storage element layer 624 disposed between the first electrode 621 and the third electrode 623, and a selective element layer 625 disposed between the third electrode 623 and the second electrode 622. The second memory cell 640 may have a same or similar to configuration to the first memory cell 620.

Figure 18:
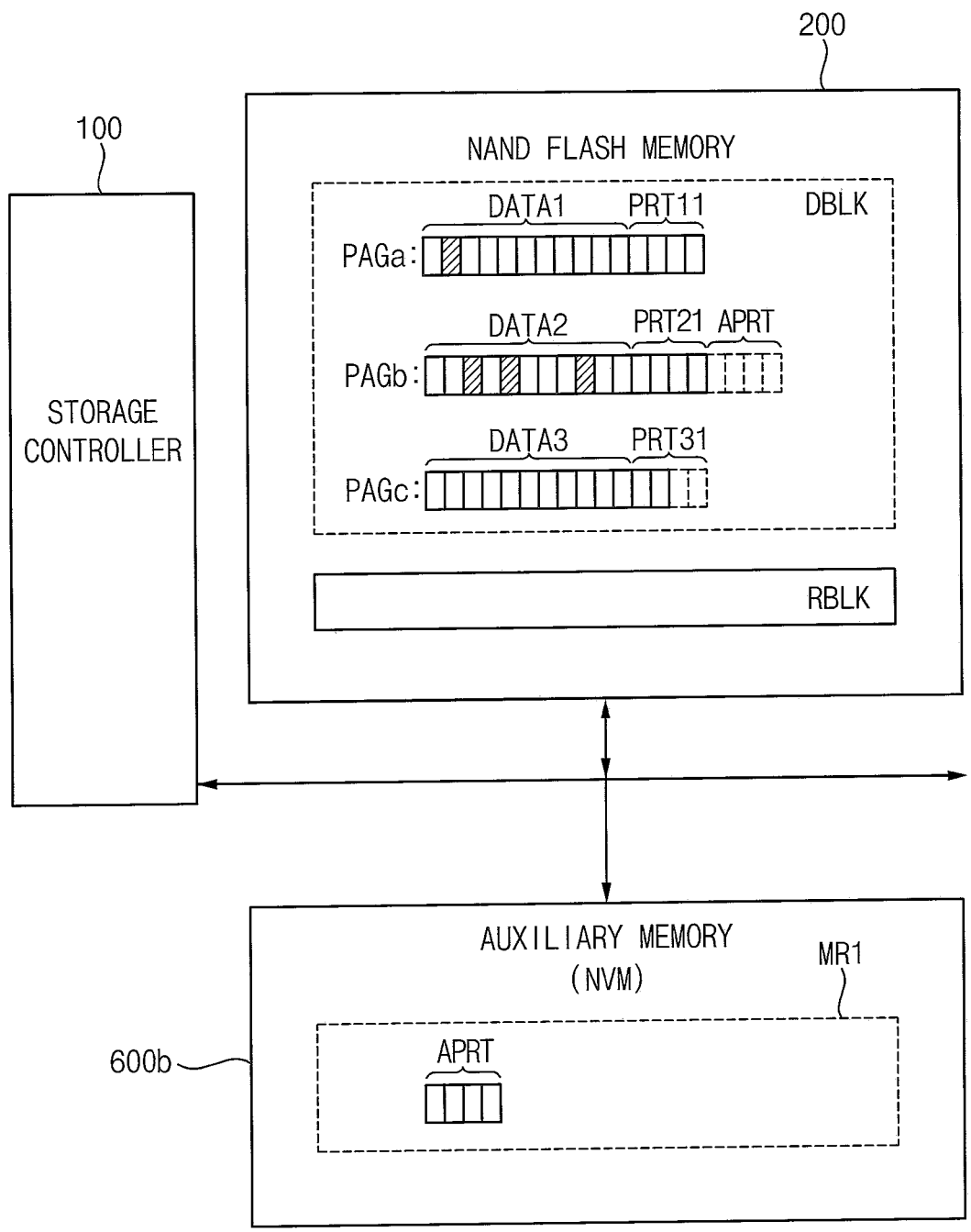
FIG. 18 is a block diagram illustrating an example of the storage device of FIG. 2A according to example embodiments.

FIG. 18 is a block diagram illustrating an example of the storage device of FIG. 2A according to example embodiments.

Referring to FIG. 18, a storage device 30a may include the storage controller 100 the NAND flash memory device 200 and an auxiliary memory device 600b.

In FIG. 18, it is assumed that the auxiliary memory device 600b is implemented with a nonvolatile memory device including one of Z-NAND, a PRAM and a MRAM. Therefore, the NAND flash memory device 200 may be accessed by unit of a page and the auxiliary memory device 600b may be accessed by unit of a byte.

The NAND flash memory device 200 may include a data block DBLK and a reserved block RBLK and the data block DBLK and the reserved block RBLK may be included in the memory cell array 300a of FIG. 11.

In FIG. 18, it is assumed that user data DATA1 stored in a page PAGa includes an error bit and user data DATA2 stored in a page PAGb includes three error bits.

When the page PAGa of the NAND flash memory device 200 is identified as a normal page, the storage controller 100 may perform a first mode of ECC encoding on the user data DATA1 to generate first parity bits PRT11, and may store the user data DATA1 and the first parity bits PRT11 in the page PAGa of the NAND flash memory device 200.

When the page PAGb of the NAND flash memory device 200 is identified as a bad page, the storage controller 100 may perform a second mode of ECC encoding on the user data DATA2 to generate first parity bits PRT21 and the additional parity bits APRT, and may store the user data DATA2 and the first parity bits PRT21 in the page PAGb of the NAND flash memory device 200 and may store the additional parity bits APRT in a memory region MR1 of the auxiliary memory device 600b. Therefore, error correction capability on the user data DATA2 stored in the page PAGb whose error occurrence probability is greater than the reference value may be enhanced.

Figure 19:
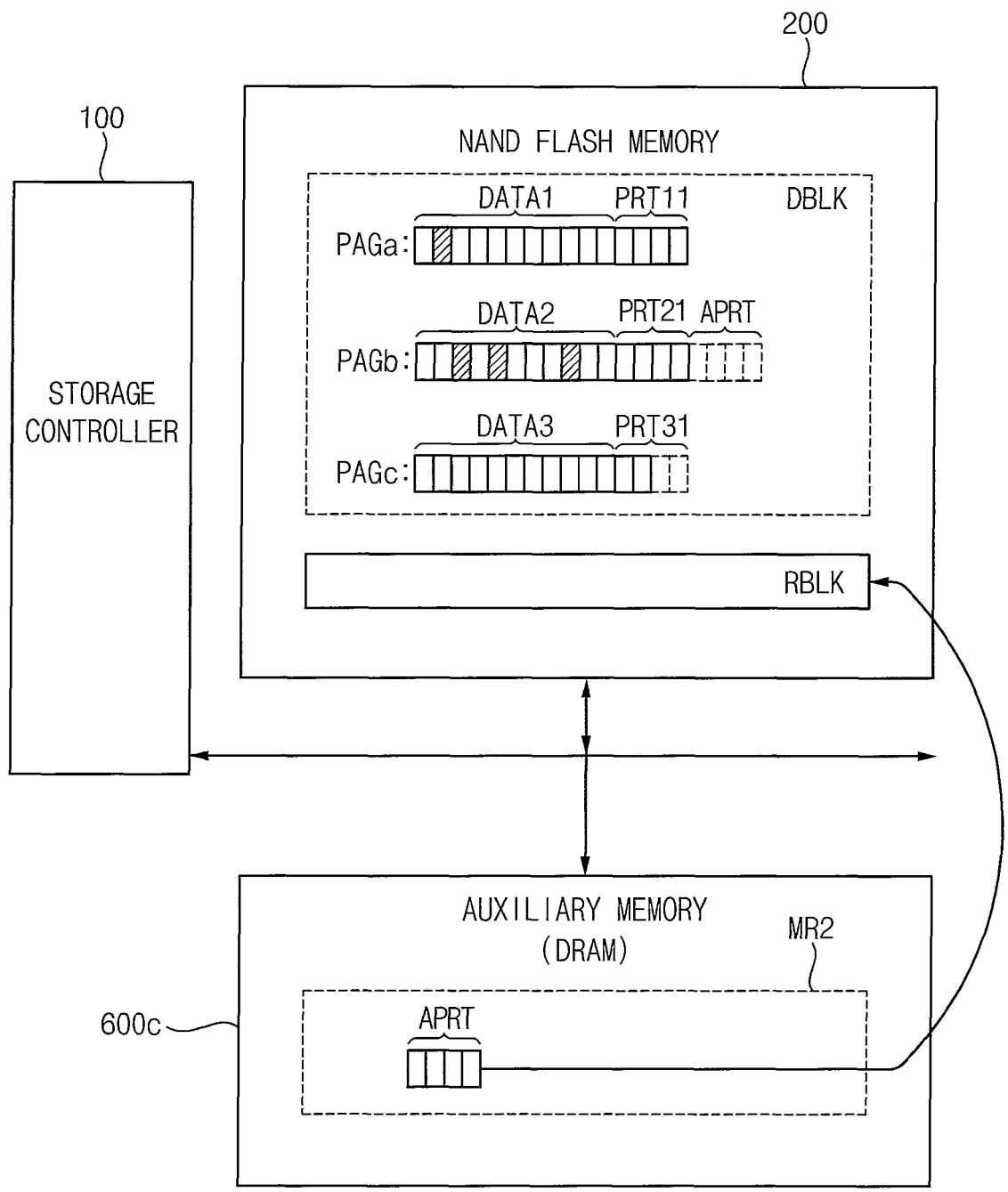
FIG. 19 is a block diagram illustrating an example of the storage device of FIG. 2A according to example embodiments.

FIG. 19 is a block diagram illustrating an example of the storage device of FIG. 2A according to example embodiments.

Referring to FIG. 19, a storage device 30b may include the storage controller 100 the NAND flash memory device 200 and an auxiliary memory device 600b.

In FIG. 19, it is assumed that the auxiliary memory device 600c is implemented with a DRAM. Therefore, the NAND flash memory device 200 may be accessed by unit of a page and the auxiliary memory device 600c may be accessed by unit of a byte.

The NAND flash memory device 200 may include a data block DBLK and a reserved block RBLK and the data block DBLK and the reserved block RBLK may be included in the memory cell array 300a of FIG. 11.

In FIG. 19, it is assumed that user data DATA1 stored in a page PAGa includes an error bit and user data DATA2 stored in a page PAGb includes three error bits.

When the page PAGa of the NAND flash memory device 200 is identified as a normal page, the storage controller 100 may perform a first mode of ECC encoding on the user data DATA1 to generate first parity bits PRT11, and may store the user data DATA1 and the first parity bits PRT11 in the page PAGa of the NAND flash memory device 200.

When the page PAGb of the NAND flash memory device 200 is identified as a bad page, the storage controller 100 may perform a second mode of ECC encoding on the user data DATA2 to generate first parity bits PRT21 and the additional parity bits APRT, and may store the user data DATA2 and the first parity bits PRT21 in the page PAGb of the NAND flash memory device 200 and may store the additional parity bits APRT in a memory region MR2 of the auxiliary memory device 600b. Therefore, error correction capability on the user data DATA2 stored in the page PAGb whose error occurrence probability is greater than the reference value may be enhanced.

When a power supplied to the storage device 30b is off, the additional parity bits APRT stored in the memory region MR2 of the auxiliary memory device 600b may be moved to the reserved block RBLK of the NAND flash memory device 200. When the power is supplied to the storage device 30b again, the additional parity bits APRT stored in the reserved block RBLK may be loaded into the memory region MR2 of the auxiliary memory device 600b.

In FIGS. 18 and 19, when a page PAGc of the NAND flash memory device 200 is identified as a good page, the storage controller 100, the storage controller 100 may perform a first mode of ECC encoding on the user data DATA1 to generate first parity bits PRT31, and may store the user data DATA1 and a portion of the first parity bits PRT31 in the page PAGc of the NAND flash memory device 200.

Figure 20:
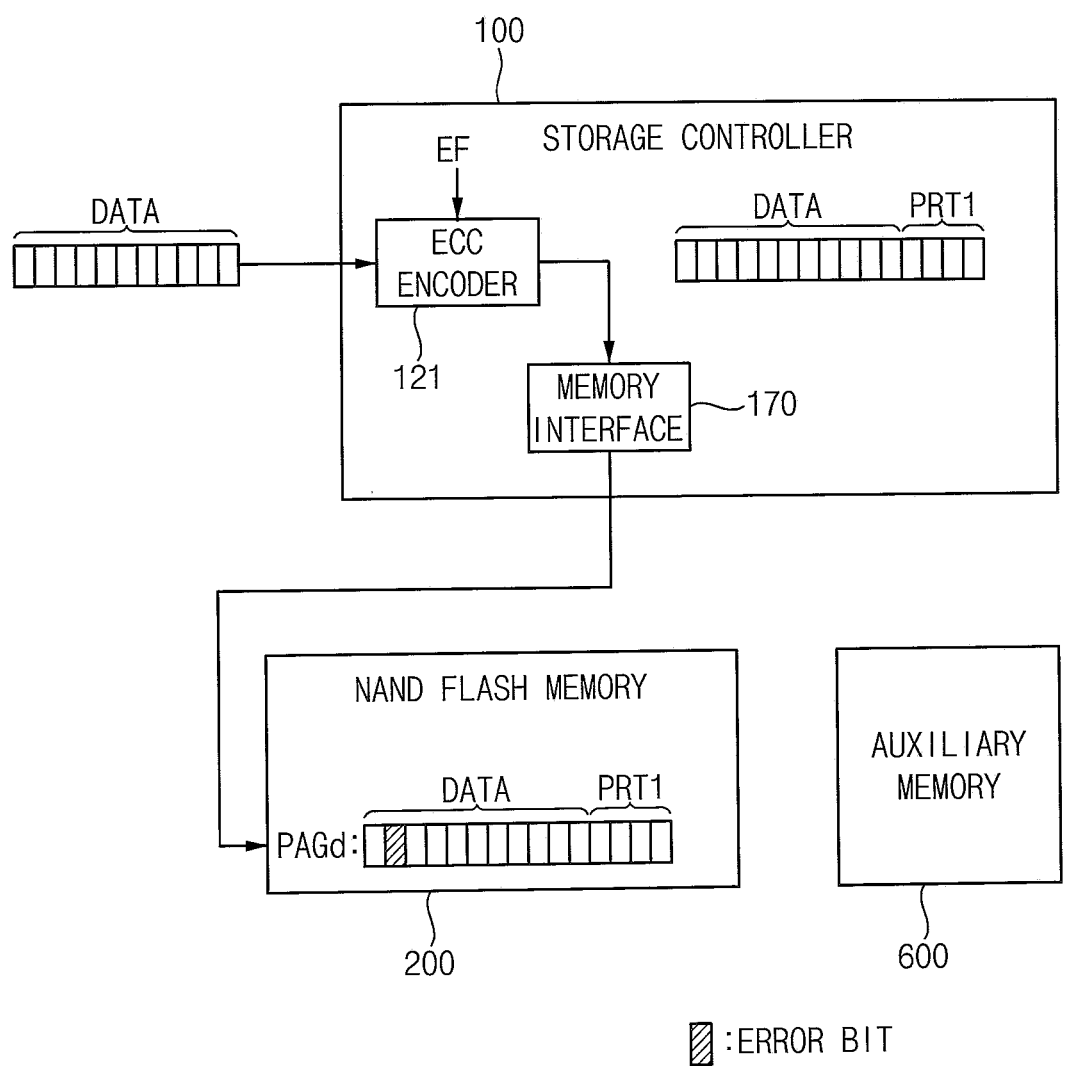
FIGS. 20 and 21 illustrate examples of write operation of the storage device of FIG. 2A according to example embodiments.
Figure 21:
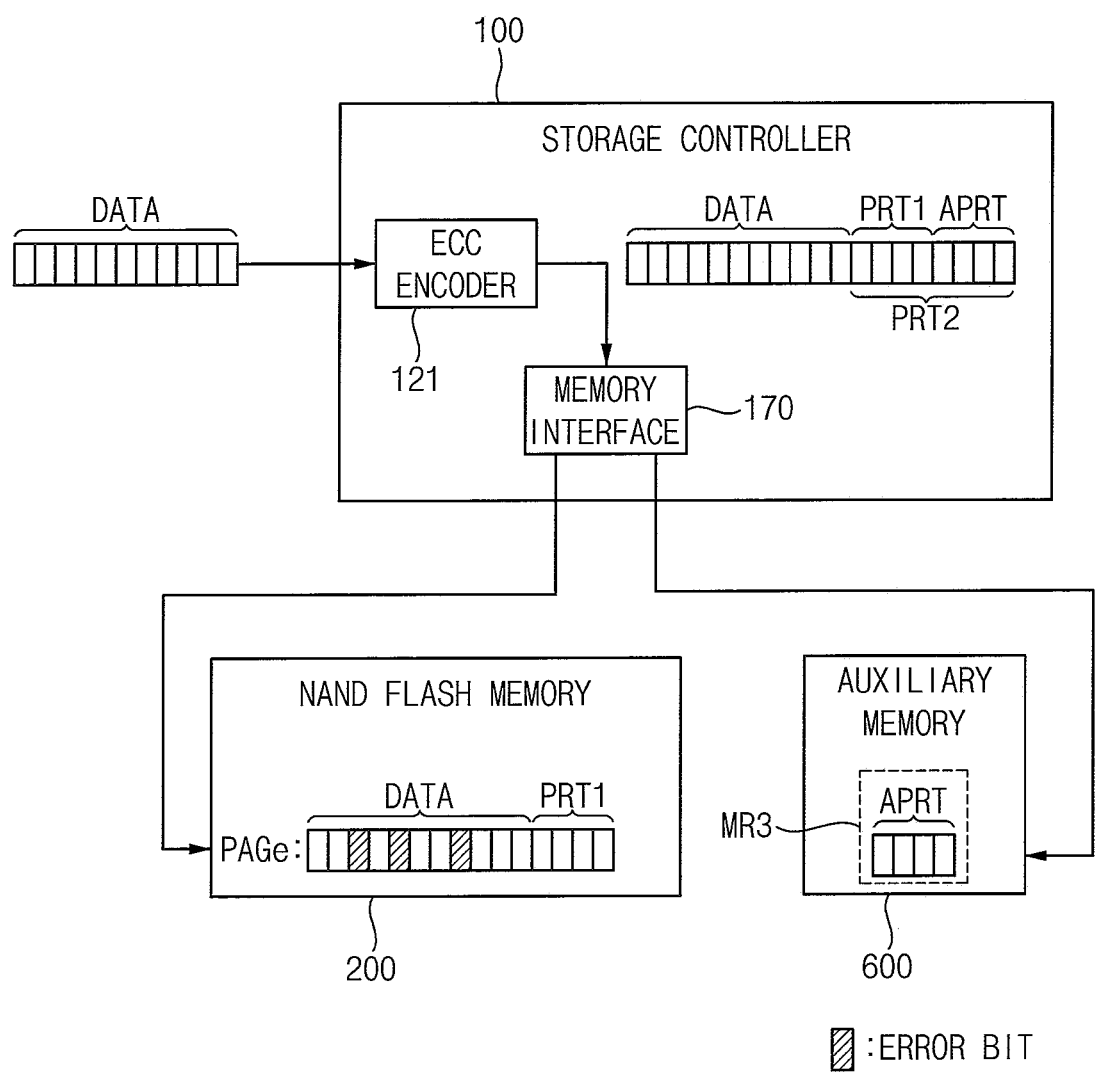

FIGS. 20 and 21 illustrate examples of write operation of the storage device of FIG. 2A according to example embodiments.

FIG. 20 illustrates an example of write operation associated with a normal page and FIG. 21 illustrates an example of write operation associated with a bad page.

Referring to FIG. 20, when a target page PAGd of the NAND flash memory device 200 is identified as a normal page, the ECC encoder 121 in the storage controller 100 may perform a first mode of ECC encoding on the user data DATA based on the error flag EF to generate the first parity bits PRT1, and may provide the user data DATA and the first parity bits PRT1 to the memory interface 170.

The memory interface 170 may transmit the user data DATA and the first parity bits PRT1 to the NAND flash memory device 200 and the NAND flash memory device 200 may store the user data DATA and the first parity bits PRT1 in the target page PAGd.

Referring to FIG. 21, when a target page PAGe of the NAND flash memory device 200 is identified as a bad page, the ECC encoder 121 in the storage controller 100 may perform a second mode of ECC encoding on the user data DATA based on the error flag EF to generate the second parity bits PRT2 including the first parity bits PRT1 and the additional parity bits APRT, and may provide the user data DATA and the second parity bits PRT2 to the memory interface 170.

The memory interface 170 may transmit the user data DATA and the first parity bits PRT1 to the NAND flash memory device 200 and may transmit the additional parity bits APRT to the auxiliary memory device 600. The NAND flash memory device 200 may store the user data DATA and the first parity bits PRT1 in the target page PAGe and the auxiliary memory device 600 may store the additional parity bits APRT in a memory region MR3.

In FIGS. 20 and 21, the user data DATA and the first parity bits PRT1 may be referred to as a first portion of the codeword generated by the ECC engine 120 and additional parity bits APRT may be referred to as a second portion of the codeword.

Although not illustrated, when data size of the user data DATA and the first parity bits PRT1 is greater than a page size of the NAND flash memory device 200, the user data DATA and a portion of the first parity bits PRT1 may be stored in a target page of the NAND flash memory device 200 as a first portion of the codeword and a different portion of the first parity bits PRT1 and the additional parity bits APRT may be stored in the auxiliary memory device 600 as the second portion of the codeword.

Although not illustrated, when data size of the user data DATA and the first parity bits PRT1 is smaller than a page size of the NAND flash memory device 200, the user data DATA, the first parity bits PRT1 and a portion of the additional parity bits APRT may be stored in a target page of the NAND flash memory device 200 as the first portion of the codeword and a different portion of the additional parity bits APRT may be stored in the auxiliary memory device 600 as the second portion of the codeword.

Figure 22:
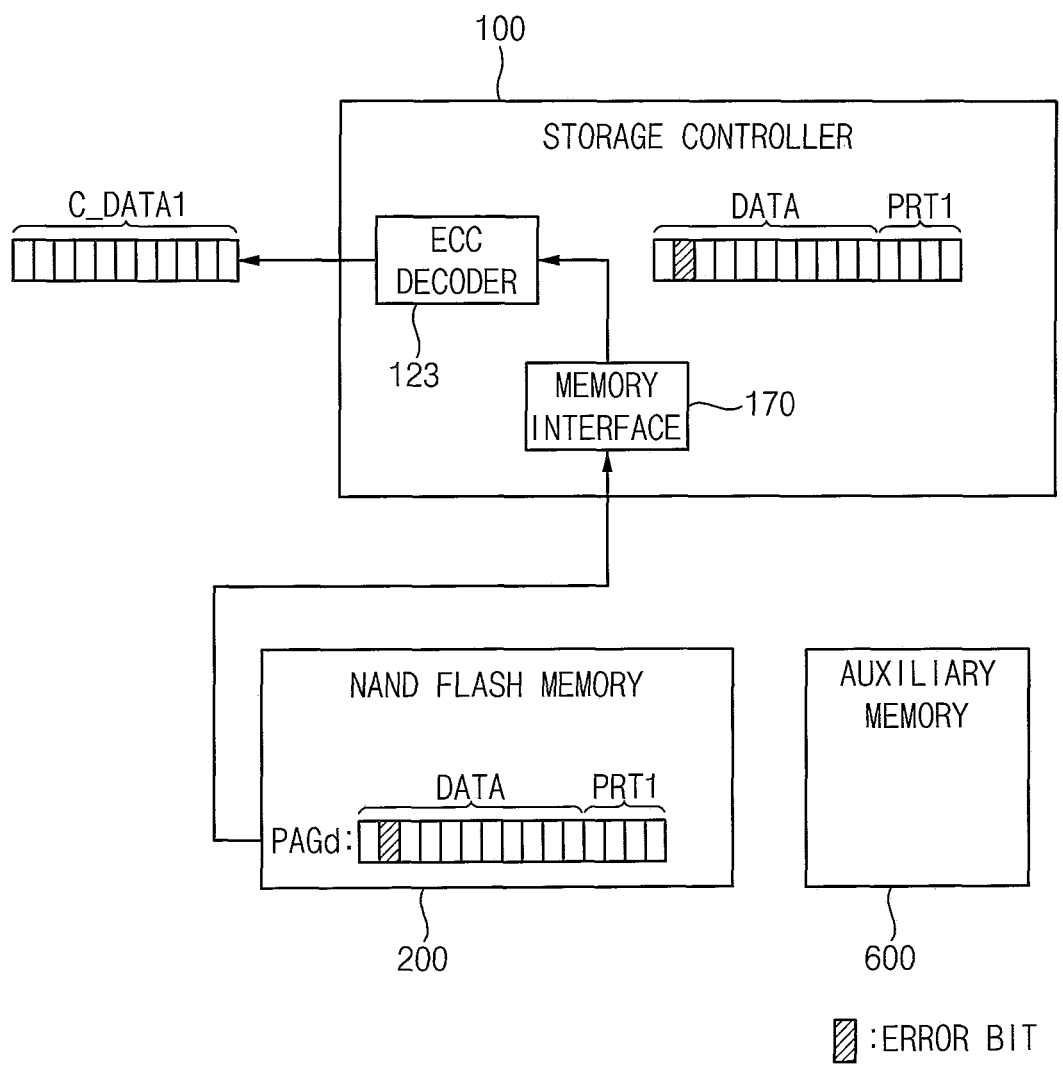
FIGS. 22 and 23 illustrate examples of read operation of the storage device of FIG. 2A according to example embodiments.
Figure 23:
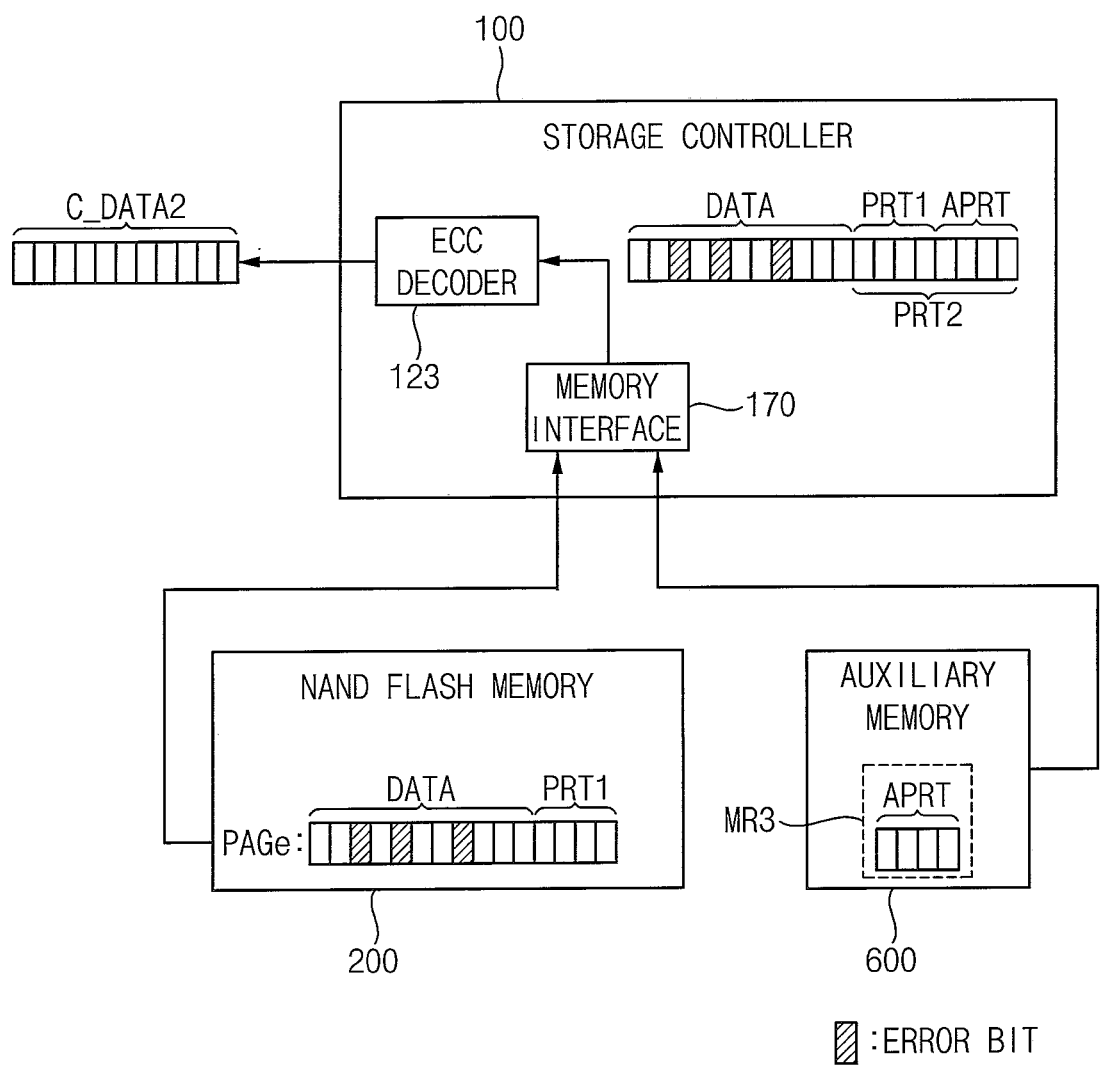

FIGS. 22 and 23 illustrate examples of read operation of the storage device of FIG. 2A according to example embodiments.

FIG. 22 illustrates an example of read operation associated with a normal page and FIG. 23 illustrates an example of read operation associated with a bad page.

Referring to FIG. 22, when a target page PAGd of the NAND flash memory device 200 is identified as a normal page, the storage controller 100 may apply a read command to the NAND flash memory device 200, and the memory interface 170 of the storage controller 100 may receive the user data DATA and the first parity bits PRT1 from the target page PAGd of the NAND flash memory device 200 to provide the user data DATA and the first parity bits PRT1 to the ECC decoder 123.

The ECC decoder 123 may perform a first mode of ECC decoding on the user data DATA and the first parity bits PRT1 to correct an error bit in the user data DATA and may provide corrected user data C_DATA to the host.

Referring to FIG. 23, when a target page PAGe of the NAND flash memory device 200 is identified as a bad page, the storage controller 100 may apply a read command to the NAND flash memory device 200 and the auxiliary memory device 600, and the memory interface 170 of the storage controller 100 may receive the user data DATA and the first parity bits PRT1 from the target page PAGd of the NAND flash memory device 200 and the additional parity bits APRT from the memory region MR3 of the auxiliary memory device 600 to provide the user data DATA, the first parity bits PRT1 and the additional parity bits APRT to the ECC decoder 123.

The ECC decoder 123 may perform a second mode of ECC decoding on the user data DATA, the first parity bits PRT1 and the additional parity bits APRT to correct error bits in the user data DATA and may provide corrected user data C_DATA to the host.

In FIG. 23, the storage controller 100 may perform read operations on the NAND flash memory device 200 and the auxiliary memory device 600 simultaneously. While the user data DATA and the first parity bits PRT1 is being read from the target page PAGe, the read additional parity bits APRT may be stored in a buffer in the memory interface 170. When the read operation on the user data DATA and the first parity bits PRT1, the memory interface 170 may provide the first parity bits PRT1 and the additional parity bits APRT to the ECC decoder 123.

Figure 24:
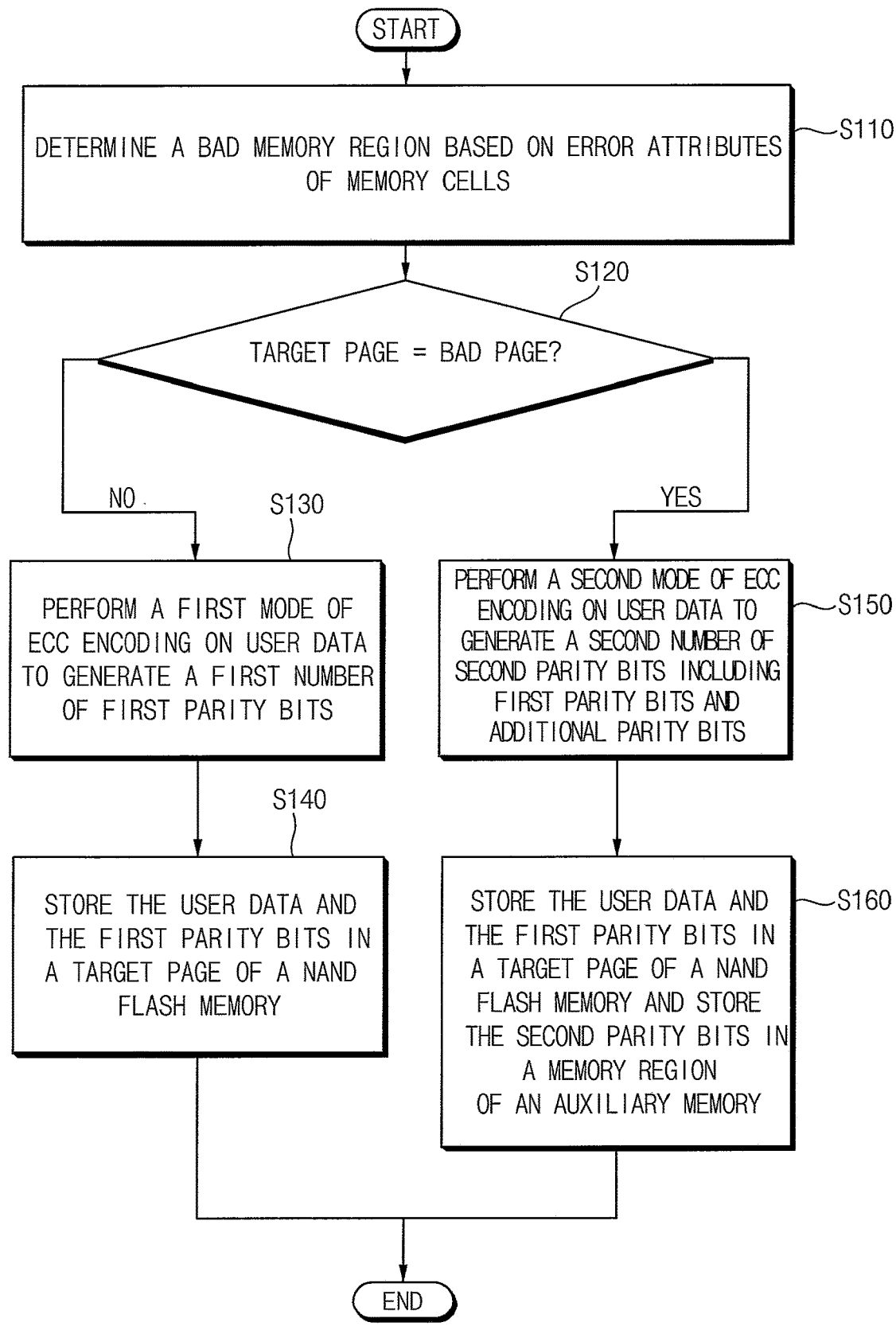
FIG. 24 is a flow chart illustrating a method of operating a storage device according to example embodiments.

FIG. 24 is a flow chart illustrating a method of operating a storage device according to example embodiments. According to an example embodiment, FIG. 24 illustrates a write operation of the storage device of FIG. 2A.

Referring to FIGS. 2A, 3 through 24, there is provided a method of operating a storage device 30 including a storage controller 100, a NAND flash memory device 200 and an auxiliary memory device 600.

The error attribute manager EAM 137 determines at least one bad memory region from among a plurality of memory regions of the NAND flash memory device 200 based on error attribute of each of the plurality of memory regions, which is based on degradation characteristic of each of the plurality of memory regions (operation S110).

The processor 110 determines whether a target page in which the user data DATA to be stored corresponds to a bad page belonging to the at least one bad memory region (operation S120).

In response to the target page not corresponding to the bad page (NO in operation S120), the ECC engine 120 performs a first mode of ECC encoding on the user data DATA to generate a first number of first parity bits PRT1 (operation S130).

The memory interface 170 transmits the user data DATA and the first parity bits PRT1 to the NAND flash memory device 200 and the NAND flash memory device 200 stores the user data DATA and the first parity bits PRT1 in the target page (operation S140).

In response to the target page corresponding to the bad page (YES in operation S120), the ECC engine 120 performs a second mode of ECC encoding on the user data DATA to generate a second number of second parity bits PRT2 including the first parity bits PRT1 and the additional parity bits APRT (operation S150).

The memory interface 170 transmits the user data DATA and the first parity bits PRT1 to the NAND flash memory device 200 and transmits the additional parity bits APRT to the auxiliary memory device 600. The NAND flash memory device 200 stores the user data DATA and the first parity bits PRT1 in the target page while the auxiliary memory device 600 stores the additional parity bits APRT in a memory region (operation S160).

Figure 25:
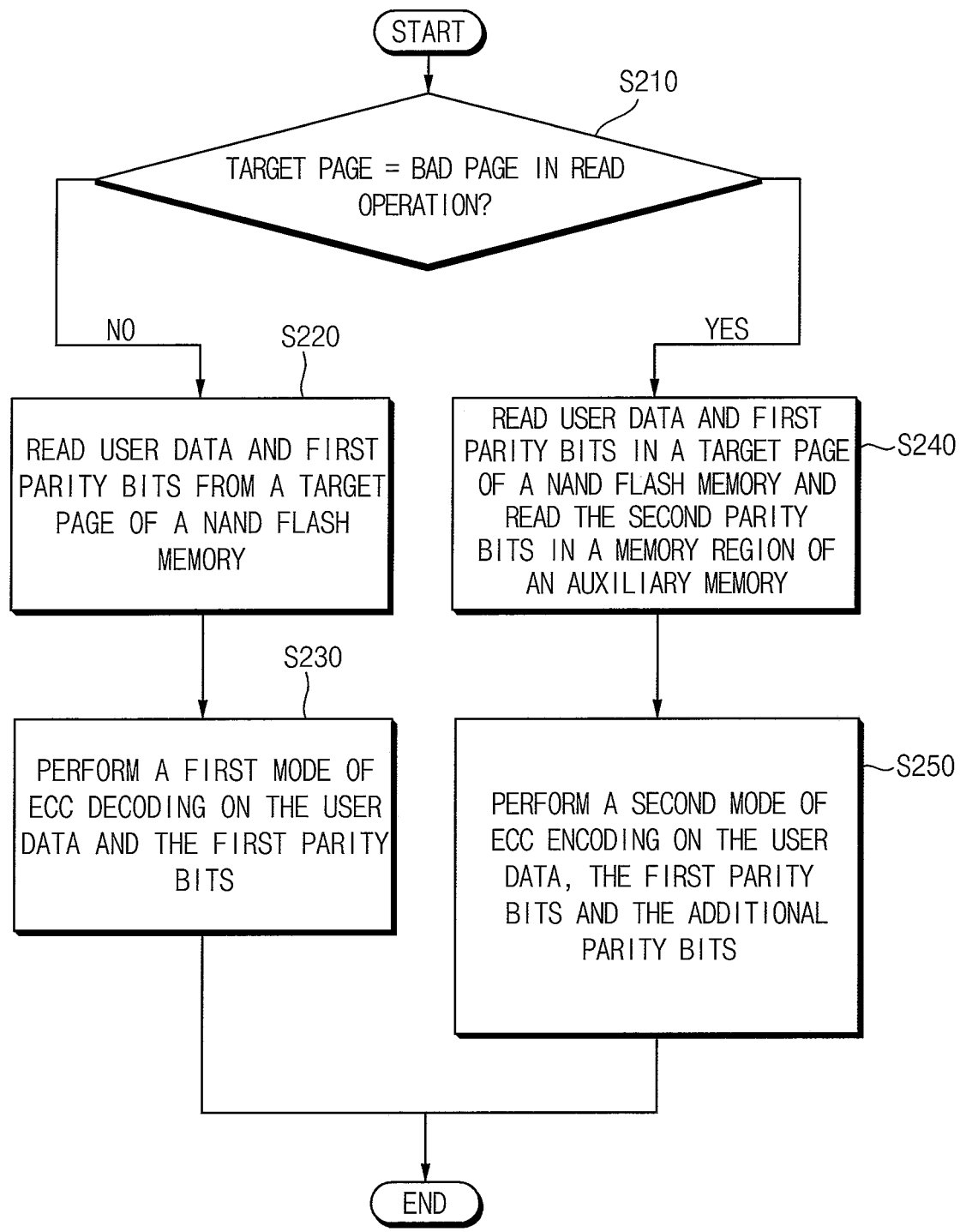
FIG. 25 is a flow chart illustrating a method of operating a storage device according to example embodiments.

FIG. 25 is a flow chart illustrating a method of operating a storage device according to example embodiments. According to an example embodiment, FIG. 25 illustrates a read operation of the storage device of FIG. 2A.

Referring to FIGS. 2A, 3 through 23 and 25, there is provided a method of operating a storage device 30 including a storage controller 100, a NAND flash memory device 200 and an auxiliary memory device 600.

The processor 110 determines whether a target page in which the user data DATA is stored corresponds to a bad page belonging to the at least one bad memory region (operation S210).

In response to the target page not corresponding to the bad page (NO in operation S210), the storage controller 100 applies a read command to the NAND flash memory device 200 to read the user data DATA and the first parity bits PRT1 from the target page of the NAND flash memory device 200 (operation S220).

The memory interface 170 provides the user data DATA and the first parity bits PRT1 to the ECC decoder 123. The ECC decoder 123 performs a first mode of ECC decoding on the user data DATA and the first parity bits PRT1 to correct an error bit in the user data DATA (operation S230).

In response to the target page corresponding to the bad page (YES in operation S210), the storage controller 100 applies a read command to the NAND flash memory device 200 and the auxiliary memory device 600 to read the user data DATA and the first parity bits PRT1 from the target page of the NAND flash memory device 200 and to read the additional parity bits APRT from a memory region of the auxiliary memory device 600 (operation S240).

The memory interface 170 of the storage controller 100 may provide the user data DATA, the first parity bits PRT1 and the additional parity bits APRT to the ECC decoder 123. The ECC decoder 123 performs a second mode of ECC decoding on the user data DATA, the first parity bits PRT1 and the additional parity bits APRT to correct error bits in the user data DATA (operation S250).

As mentioned above, according to a method of operating the storage device 30, the ECC engine 120 in the storage controller 100 generates different number of parity bits based on determining whether a target page to store the user data correspond to a normal page or a bad page based on error attribute of a target memory region including the target page, the ECC engine 120 generates additional parity bits in response to the target page corresponding to the bad page, the storage controller 100 stores the additional parity bits in the auxiliary memory device 600, and the ECC engine 120 correct error bits in the user data DATA based on the first parity bits and additional parity bits in a read operation to enhance error correction capability. Therefore, the storage controller 100 may enhance data retention characteristic of the NAND flash memory device 200.

Figure 26:
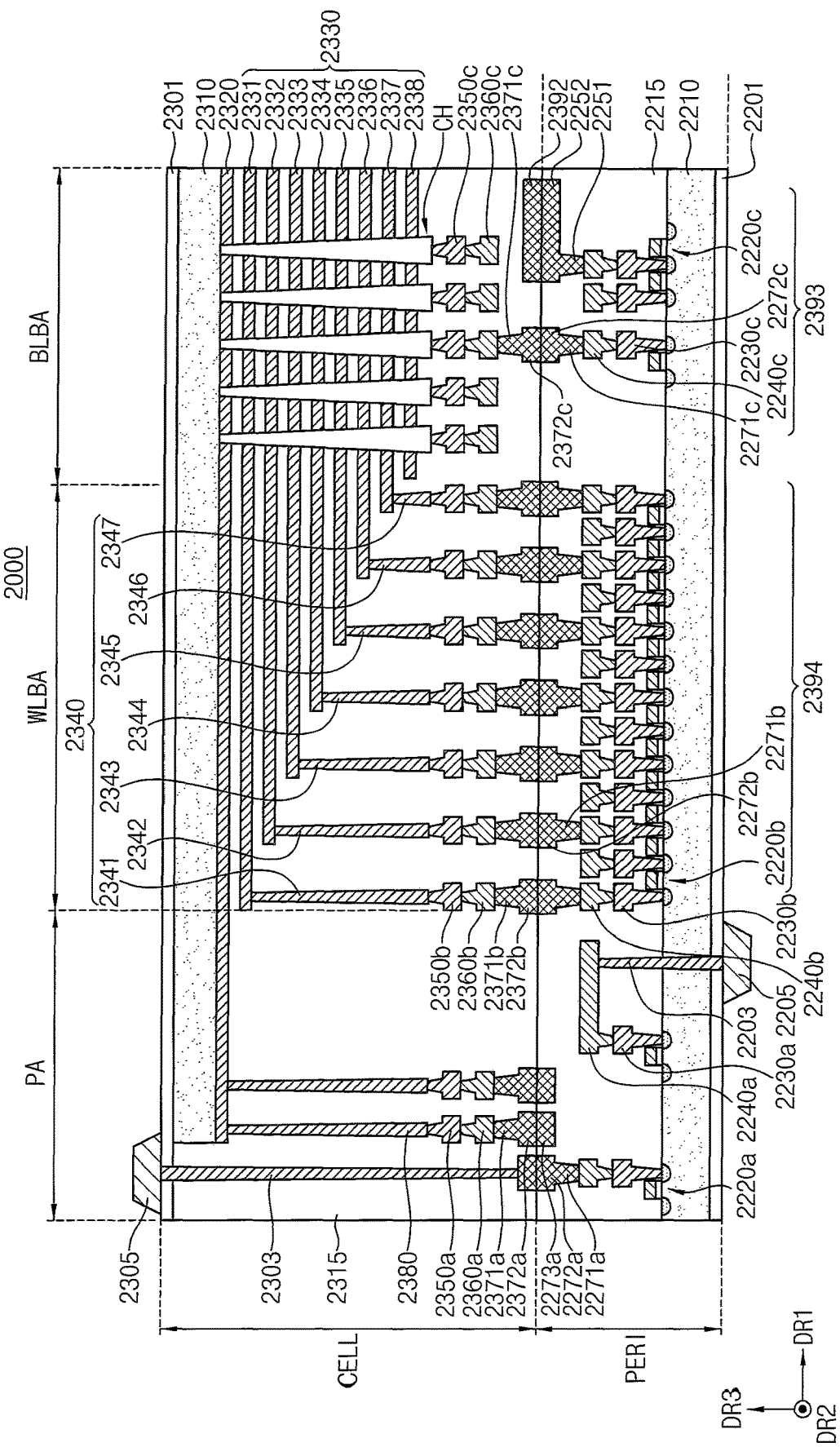
FIG. 26 is a cross-sectional view of a nonvolatile memory device according to example embodiments.

FIG. 26 is a cross-sectional view of a nonvolatile memory device according to example embodiments.

Referring to FIG. 26, a nonvolatile memory device or a memory device 2000 may have a chip-to-chip (C2C) structure. The C2C structure may refer to a structure formed by manufacturing/fabricating an upper chip including a memory cell region or a cell region CELL on a first wafer, manufacturing/fabricating a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. In some example embodiments, when the bonding metals may include copper (Cu) using a Cu-to-Cu bonding. The example embodiments, however, may not be limited thereto. In some example embodiments, the bonding metals may also be formed of aluminum (Al) and/or tungsten (W).

Each of the peripheral circuit region PERI and the cell region CELL of the memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c connected to the plurality of circuit elements 2220a, 2220b, and 2220c, and second metal layers 2240a, 2240b, and 2240c formed on the first metal layers 2230a, 2230b, and 2230c, respectively. In some example embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In example embodiments illustrated in FIG. 26, although only the first metal layers 2230a, 2230b, and 2230c and the second metal layers 2240a, 2240b, and 2240c are shown and described, the example embodiment is not limited thereto, and one or more additional metal layers may be further formed on the second metal layers 2240a, 2240b, and 2240c. At least a portion of the one or more additional metal layers formed on the second metal layers 2240a, 2240b, and 2240c may be formed of aluminum or the like having a lower electrical resistivity than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word-line bonding area WLBA. In the word-line bonding area WLBA, the lower bonding metals 2271b and 2272b in the peripheral circuit region PERI may be electrically bonded to upper bonding metals 2371b and 2372b of the cell region CELL. The lower bonding metals 2271b and 2272b and the upper bonding metals 2371b and 2372b may be formed of aluminum, copper, tungsten, and/or the like. Further, the upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (e.g., 2330) may be stacked in a third direction D3 (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the third direction D3, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. In some example embodiments, the first metal layer 2350c may be a bit-line contact, and the second metal layer 2360c may be a bit-line. In some example embodiments, the bit-line 2360c may extend in a second direction D2 (e.g., a Y-axis direction), parallel to the upper surface of the second substrate 2310.

In some example embodiments illustrated in FIG. 23, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction D1 (e.g., an X-axis direction), parallel to the upper surface of the second substrate 2310 and perpendicular to the second direction D2, and may be connected to a plurality of cell contact plugs 2341, 2342, 2343, 2344, 2345, 2346, and 2347 (e.g., 2340). The plurality of word-lines 2330 and the plurality of cell contact plugs 2340 may be connected to each other in pads provided by at least a portion of the plurality of word-lines 2330 extending in different lengths in the first direction D1. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In some example embodiments, operating voltages of the circuit elements 2220b forming the row decoder 2394 may be different than operating voltages of the circuit elements 2220c forming the page buffer 2393. In some example embodiments, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, and/or the like, and may be electrically connected to the common source line 2320. A first metal layer 2350a and a second metal layer 2360a may be stacked on an upper portion of the common source line contact plug 2380, sequentially. In some example embodiments, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. Alternatively or additionally, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303. In some example embodiments, the second input/output pad 2305 is electrically connected to a circuit element 2220a.

According to embodiments, the second substrate 2310 and the common source line 2320 may not be disposed in an area in which the second input/output contact plug 2303 is disposed. Also, the second input/output pad 2305 may not overlap the word-lines 2330 in the third direction D3. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. In some example embodiments, the memory device 2000 may include only the first input/output pad 2205 disposed on the first substrate 2210 or the second input/output pad 2305 disposed on the second substrate 2310. Alternatively, the NAND flash memory device 200 may include both the first input/output pad 2205 and the second input/output pad 2305.

A metal pattern provided on an uppermost metal layer may be provided as a dummy pattern (e.g., an electrically inactive pattern) or the uppermost metal layer may be absent, in each of the external pad bonding area PA and the bit-line bonding area BLBA, respectively included in the cell region CELL and the peripheral circuit region PERI.

In the external pad bonding area PA, the NAND flash memory device 2000 may include a lower metal pattern 2273a, corresponding to an upper metal pattern 2372a formed in an uppermost metal layer of the cell region CELL, and having the same or similar cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273a formed in an uppermost metal layer of the peripheral circuit region PERI, and having the same shape as a lower metal pattern 2273a of the peripheral circuit region PERI, may be formed in an uppermost metal layer of the cell region CELL.

The lower bonding metals 2271b and 2272b may be formed on the second metal layer 2240b in the word-line bonding area WLBA. In the word-line bonding area WLBA, the lower bonding metals 2271b and 2272b of the peripheral circuit region PERI may be electrically connected to the upper bonding metals 2371b and 2372b of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same or similar cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In some example embodiments, corresponding to a metal pattern formed in an uppermost metal layer in one of the cell region CELL and the peripheral circuit region PERI, a reinforcement metal pattern having the same or similar cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271b and 2272b in the peripheral circuit region PERI and upper bonding metals 2371b and 2372b of the cell region CELL.

Figure 27:
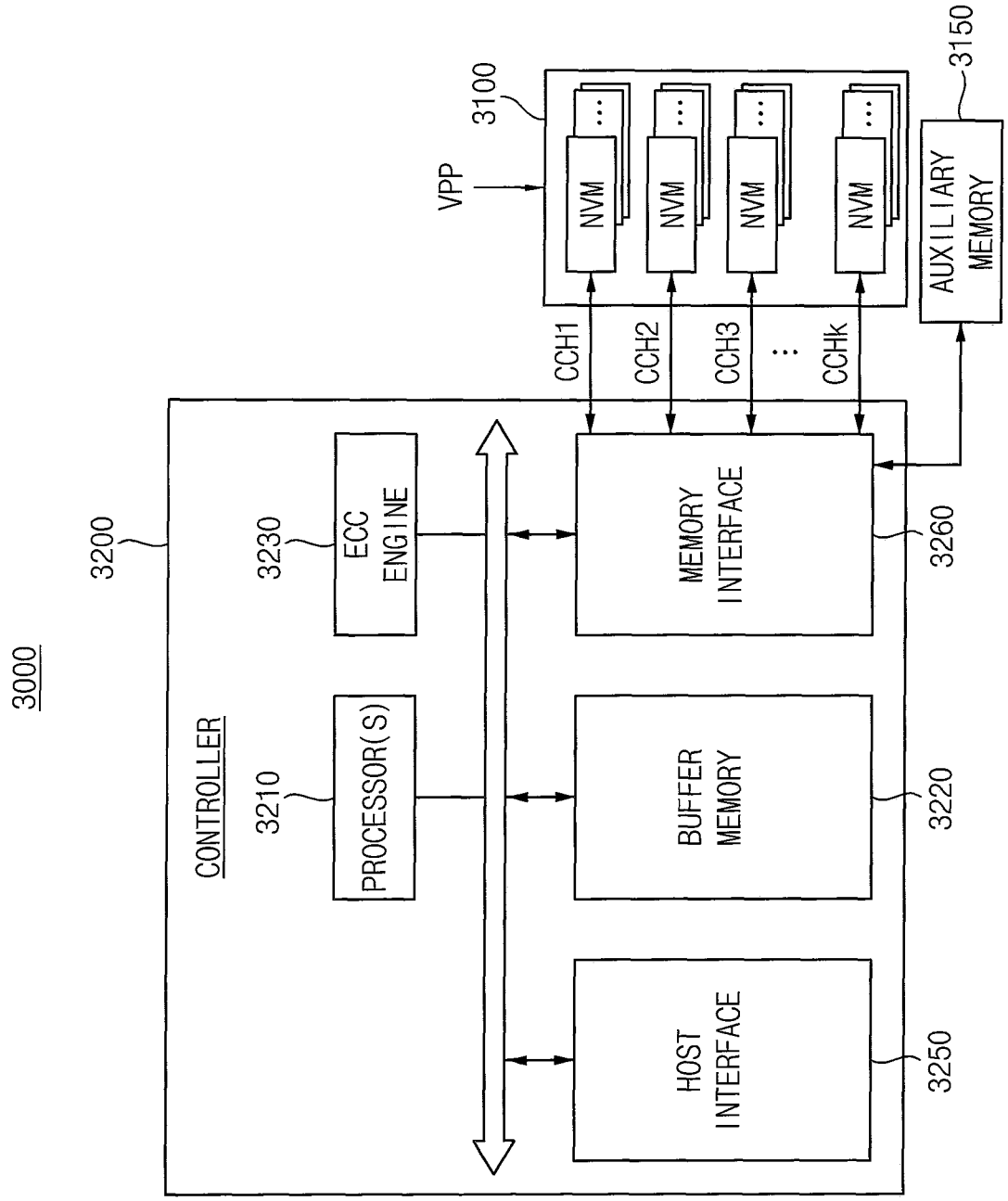
FIG. 27 is a block diagram illustrating a storage device that includes a nonvolatile memory device according to example embodiments.

FIG. 27 is a block diagram illustrating a storage device that includes a nonvolatile memory device according to example embodiments.

Referring to FIG. 27, a storage device 3000 includes a plurality of nonvolatile memory devices 3100, a controller 3200 and an auxiliary memory device 3150. In some example embodiments, the storage device 3000 may be any storage device such as an embedded multimedia card (eMMC), a universal flash storage (UFS), a solid state disc or solid state drive (SSD), etc. Each of the plurality of nonvolatile memory devices 3100 may employ the NAND flash memory device 200 NAND flash memory device 200 of FIG. 6.

The controller 3200 may be connected to the nonvolatile memory devices 3100 via a plurality of channels CCH1, CCH2, CCH3, . . . , CCHk (k being a positive integer). The controller 3200 may include one or more processors 3210, a buffer memory 3220, an error correction code (ECC) engine 3230, a host interface 3250 and a nonvolatile memory (NVM) interface 3260.

The buffer memory 3220 may store data used to drive the controller 3200. The buffer memory 3220 may store data used for program operation. The buffer memory 3220 may store error attribute information of memory cells of each of the plurality of nonvolatile memory devices 3100.

The ECC engine 3230 may calculate error correction code values of data to be programmed during a program operation, and may correct an error of read data using an error correction code value during a read operation. In a data recovery operation, the ECC engine 3230 may correct an error of data recovered from the nonvolatile memory devices 3100. The ECC engine 3230 may employ the ECC engine 120 of FIG. 4. Therefore, the ECC engine 3230 may selectively generate additional parity bits based on a target page corresponding to a bad page and may store the additional parity bits in the auxiliary memory device 3150.

The host interface 3250 may provide an interface with an external device. The nonvolatile memory interface 3260 may provide an interface with the nonvolatile memory devices 3100.

Each of the nonvolatile memory devices 3100 may correspond to the nonvolatile memory device according to example embodiments, and may be optionally supplied with an external high voltage VPP.

A nonvolatile memory device, a storage device or an auxiliary memory device according to example embodiments may be packaged using various package types or package configurations.

The example embodiment of the disclosure may be applied to various electronic devices including a nonvolatile memory device. For example, the example embodiment of the disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims.

What is claimed is:

1. A storage device comprising:
   a NAND flash memory device comprising a data block including a plurality of pages;
   an auxiliary memory device provided separately from the NAND flash memory device; and
   a storage controller configured to control the NAND flash memory device and the auxiliary memory device,
   wherein the storage controller comprises:
      a processor configured to execute a flash translation layer (FTL) loaded onto an on-chip memory of the storage controller;
      an error correction code (ECC) engine configured to:
         generate, for each of the plurality of pages in the data block, one or more first parity bits for data to be stored in the plurality of pages based on an error attribute of a target memory region associated with the plurality of pages,
         determine, for each of the plurality of pages, whether one or more additional parity bits are to be generated based on an error occurrence probability of the respective page; and
         selectively generate the one or more additional parity bits for the data in a target page, among the plurality of pages, under control of the processor based on a result of a determination that the one or more additional parity bits are to be generated for the target page; and
      a memory interface configured to:
         transmit the data and the one or more first parity bits to the NAND flash memory device to be stored in each of the plurality of pages in the data block, and
         selectively transmit the one or more additional parity bits of the target page to the auxiliary memory device to be stored external to the target page.

2. The storage device of claim 1, wherein the ECC engine is configured to:
   generate the one or more first parity bits by performing an ECC encoding on the data in one or more first pages using a first sub matrix of a parity matrix based on the one or more first pages being identified as a normal page, which has a first error occurrence probability equal to or smaller than a reference value; and
   generate second parity bits including the one or more first parity bits and the one or more additional parity bits by performing the ECC encoding on the data using the first sub matrix and a second sub matrix of the parity matrix based on the target page being identified as a bad page, which has a second error occurrence probability greater than the reference value.

3. The storage device of claim 2, wherein the memory interface is configured to:
   transmit the data and the one or more first parity bits to the NAND flash memory device based on the one or more first pages corresponding to the normal page; and
   transmit the one or more additional parity bits to the auxiliary memory device based on the target page corresponding to the bad page.

4. The storage device of claim 2, wherein the FTL include an error attribute manager configured to manage an error attribute of each of a plurality of memory regions of the NAND flash memory device.

5. The storage device of claim 4, wherein the error attribute manager is configured to provide the processor and the ECC engine with an error flag indicating whether the target page corresponds to the bad page based on an address designating the target page.

6. The storage device of claim 2, wherein the ECC engine is configured to perform a first mode of ECC decoding on the data and the one or more first parity bits read from the NAND flash memory device to correct errors of the data, based on the one or more first pages corresponding to the normal page in a read operation.

7. The storage device of claim 6, wherein the ECC engine is configured to perform a second mode of ECC decoding on the data and the one or more first parity bits read from the NAND flash memory device and the one or more additional parity bits read from the auxiliary memory device to correct errors of the data, based on the target page corresponding to the bad page in a read operation.

8. The storage device of claim 1, wherein the target memory region corresponds to one or more of a memory block, a word-line or a page of a memory cell array of the NAND flash memory device.

9. The storage device of claim 1, wherein:
   an access unit of the auxiliary memory device is smaller than an access unit of the NAND flash memory device;
   the access unit of the auxiliary memory device corresponds to one of a byte and multiple bytes; and
   the access unit of the NAND flash memory device corresponds to a page.

10. The storage device of claim 1, wherein a latency of a write operation or a read operation of the auxiliary memory device is smaller than a latency of a write operation or a read operation of the NAND flash memory device.

11. The storage device of claim 1, wherein:
the auxiliary memory device comprises one of a Z-NAND, a phase change random access memory (PRAM), a magnetic random access memory (MRAM) or a dynamic random access memory (DRAM);
the storage controller is configured to perform a write or read operation associated with the data and the one or more first parity bits one the NAND flash memory device and a write or read operation associated with the one or more additional parity bits on the auxiliary memory device in parallel; and
an execution interval of the write or read operation on the NAND flash memory device and an execution interval of the write or read operation on the auxiliary memory device are partially overlapped.

12. The storage device of claim 1, wherein:
the auxiliary memory device comprises a dynamic random access memory (DRAM); and
wherein the storage controller is configured to move the one or more additional parity bits stored in the DRAM to a reservation block of the NAND flash memory device based on a power of the storage device.

13. The storage device of claim 1, wherein NAND flash memory device comprises;
a memory cell array comprises a plurality of cell strings, each of the plurality of cell strings comprises a plurality of memory cells stacked in a vertical direction with respect to a substrate;
a voltage generator configured to generate word-line voltages based on control signals;
an address decoder coupled to the memory cell array through a plurality of word-lines, the address decoder configured to transfer the word-line voltages to the memory cell array based on a row address;
a page buffer circuit coupled to the memory cell array through a plurality of bit-lines, the page buffer circuit configured to store the data and the one or more first parity bits in the memory cell array; and
a control circuit configured to control the voltage generator, the address decoder and the page buffer circuit based on a command and an address received from the storage controller,
wherein the plurality of cell strings are divided into a plurality of planes, and
wherein the ECC engine is configured to generate different number of parity bits based on a physical location of a plane to which the target memory region belongs.

14. The storage device of claim 1, wherein, wherein NAND flash memory device comprises;
a memory cell region comprises a memory cell array and a first metal pad, the memory cell array comprises a plurality of cell strings, each of the plurality of cell strings comprises a plurality of memory cells stacked in a vertical direction with respect to a substrate; and
a peripheral circuit region comprises a second metal pad, the peripheral circuit region vertically connected to the memory cell region through the first metal pad and the second metal pad;
wherein the peripheral circuit region comprises:
a voltage generator configured to generate word-line voltages based on control signals;
an address decoder coupled to the memory cell array through a plurality of word-lines, the address decoder configured to transfer the word-line voltages to the memory cell array based on a row address;
a page buffer circuit coupled to the memory cell array through a plurality of bit-lines, the page buffer circuit configured to store the data and the one or more first parity bits in the memory cell array; and
a control circuit configured to control the voltage generator, the address decoder and the page buffer circuit based on a command and an address received from the storage controller.

15. A storage device comprising:
a first NAND flash memory device comprising a data block including a plurality of pages;
an auxiliary memory device provided separately from the first NAND flash memory device; and
a storage controller configured to control the first NAND flash memory device and the auxiliary memory device, wherein the storage controller comprises:
a processor configured to execute a flash translation layer (FTL) loaded onto an on-chip memory;
an error correction code (ECC) engine configured to:
determine, for each or the plurality of pages, whether a respective page is a normal page or a bad page based on an error occurrence probability of the respective page;
generate, for each of first pages among the plurality of pages in the data block identified as the normal page, one or more first parity bits for data to be stored in the plurality of pages based on an error attribute of a target memory region associated with plurality of pages, and
generate, for each of one or more second pages among the plurality of pages in the data block identified as the bad page, second parity bits including the one or more first parity bits and one or more additional parity bits for the data based on the error occurrence probability of the one or more second pages; and
a memory interface configured to:
transmit a first portion of a codeword including the data and the one or more first parity bits to the first NAND flash memory device to be stored in each of the first pages in the data block, and
transmit a second portion of the codeword including the second parity bits to the auxiliary memory device to be stored external to the one or more second pages based on the one or more second pages being identified as the bad page, and
wherein a first error occurrence probability of the normal page is equal to or smaller than a reference value and a second error occurrence probability of the bad page is greater than the reference value.

16. The storage device of claim 15, the ECC engine is configured to:
generate the one or more first parity bits by performing a first mode of ECC encoding on the data using a first sub matrix of a parity matrix based on the first pages corresponding to the normal page; and
generate the one or more first parity bits and the one or more additional parity bits by performing a second mode of ECC encoding on the data using the first sub matrix and a second sub matrix of the parity matrix based on the one or more second pages corresponding to the bad page.

17. The storage device of claim 15,
wherein the target memory region corresponds to one or more of a memory block, a word-line or a page of a memory cell array of the NAND flash memory device,
wherein the auxiliary memory device includes one of a Z-NAND, a phase change random access memory (PRAM), a magnetic random access memory (MRAM) or a dynamic random access memory (DRAM), wherein an access unit of the auxiliary memory device is smaller than an access unit of the NAND flash memory device, and wherein the storage controller is configured to perform a write or read operation associated with the data and the one or more first parity bits on the NAND flash memory device and a write or read operation associated with the one or more additional parity bits on the auxiliary memory device in parallel.

18. The storage device of claim 15, further comprising:
a second NAND flash memory device controlled by the storage controller,
wherein each of the first NAND flash memory device and the second NAND flash memory device includes a memory cell array comprises a plurality of cell strings, each of the plurality of cell strings comprising a plurality of memory cells stacked in a vertical direction with respect to a substrate,
wherein the plurality of cell strings are divided into a plurality of planes, and
wherein the ECC engine is configured to generate a different number of parity bits based on at least one of:
a physical location of a plane to which the target memory region belongs;
physical locations of dies on which the first NAND flash memory device and the second NAND flash memory device are provided; and
whether the target memory region belongs to which one of the first NAND flash memory device and the second NAND flash memory device.

19. A storage device comprising:
a NAND flash memory device comprising a data block including a plurality of pages, each of the plurality of pages storing data and one or more first parity bits in association with each other based on an error attribute associated with the plurality of page;
an auxiliary memory device provided separately from the NAND flash memory device, the auxiliary memory device storing one or more additional parity bits corresponding to one or more pages, among the plurality of pages; and
a storage controller configured to control the NAND flash memory device and the auxiliary memory device,
wherein the storage controller includes:
a processor configured to execute a flash translation layer (FTL) loaded onto an on-chip memory;
a memory interface configured to:
receive the data and the one or more first parity bits from the NAND flash memory device based on a target page, among the plurality of pages of the NAND flash memory device being identified as to a normal page based on an error attribute of a target memory region associated with the target page, and
receive the one or more first parity bits from the NAND flash memory device and the one or more additional parity bits from the auxiliary memory device for the data based on the target page being identified as a bad page; and
an error correction code (ECC) engine configured to:
perform a first mode of ECC decoding on the data and the one or more first parity bits read from the NAND flash memory device to correct errors of the data, based on the target page being identified as the normal page,
perform a second mode of ECC decoding on the data and the one or more first parity bits read from the NAND flash memory device and the one or more additional parity bits read from the auxiliary memory device to correct errors of the data, based on the target page being identified as the bad page, and
wherein a first error occurrence probability of the normal page is equal to or smaller than a reference value and a second error occurrence probability of the bad page is greater than the reference value.

20. The storage device of claim 19,
wherein the ECC engine is configured to:
perform the first mode of ECC decoding on the data and the first parity bits using a first sub matrix of a parity matrix based on the target page corresponding to the normal page; and
perform the second mode of ECC decoding on the data, the first parity bits and the one or more additional parity bits using the first sub matrix and a second sub matrix of the parity matrix based on the target page corresponding to the bad page,
wherein the target memory region corresponds to one or more of a memory block, a word-line and a page of a memory cell array of the NAND flash memory,
wherein the auxiliary memory device includes one of a Z-NAND, a phase change random access memory (PRAM), a magnetic random access memory (MRAM) and a dynamic random access memory (DRAM),
wherein an access unit of the auxiliary memory device is smaller than an access unit of the NAND flash memory device, and
the storage controller is configured to perform a write or read operation associated with the data and the first parity bits one the NAND flash memory device and a write or read operation associated with the one or more additional parity bits on the auxiliary memory device in parallel.

* * * * *